(12) United States Patent
Takeda

(10) Patent No.: US 8,053,815 B2
(45) Date of Patent: Nov. 8, 2011

(54) SOLID-STATE IMAGE PICKUP DEVICE, METHOD OF MANUFACTURING SOLID-STATE IMAGE PICKUP DEVICE, AND IMAGE PICKUP DEVICE

(75) Inventor: Takeshi Takeda, Kanagawa (JP)

(73) Assignee: Sony Corporation, Tokyo (JP)

( * ) Notice: Subject to any disclaimer, the term of this patent is extended or adjusted under 35 U.S.C. 154(b) by 567 days.

(21) Appl. No.: 12/230,156

(22) Filed: Aug. 25, 2008

(65) Prior Publication Data
US 2009/0085070 A1    Apr. 2, 2009

(30) Foreign Application Priority Data
Sep. 27, 2007  (JP) ................. 2007-251434

(51) Int. Cl.
H01L 31/102   (2006.01)
H01L 31/101   (2006.01)
H01L 31/107   (2006.01)
H01L 27/148   (2006.01)

(52) U.S. Cl. ........ 257/222; 257/184; 257/185; 257/186; 257/187

(58) Field of Classification Search ................. 257/184, 257/187, 222
See application file for complete search history.

(56) References Cited

FOREIGN PATENT DOCUMENTS
JP    2003-060819    2/2003

*Primary Examiner* — Ha Tran T Nguyen
*Assistant Examiner* — Valerie N Brown
(74) *Attorney, Agent, or Firm* — Rader, Fishman & Grauer PLLC

(57) ABSTRACT

Disclosed herein is a solid-state image pickup device including, a plurality of light receiving units, a transfer channel, a first transfer electrode, a second transfer electrode, first wiring, and second wiring.

20 Claims, 26 Drawing Sheets

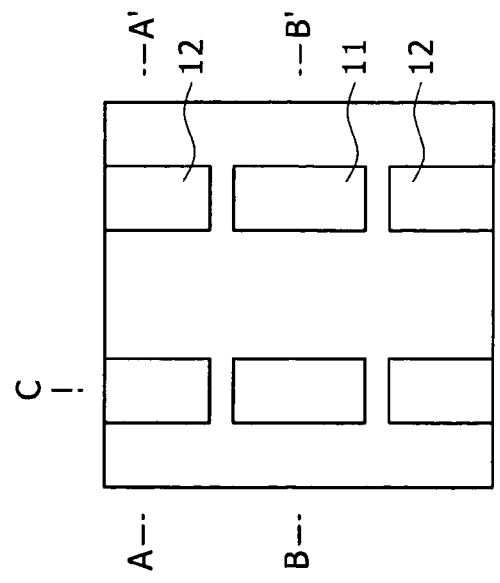
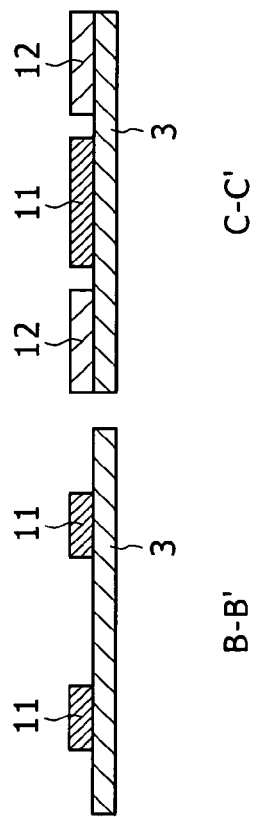
FIG. 3A
FIG. 3B  A-A'
FIG. 3C  B-B'
FIG. 3D  C-C'

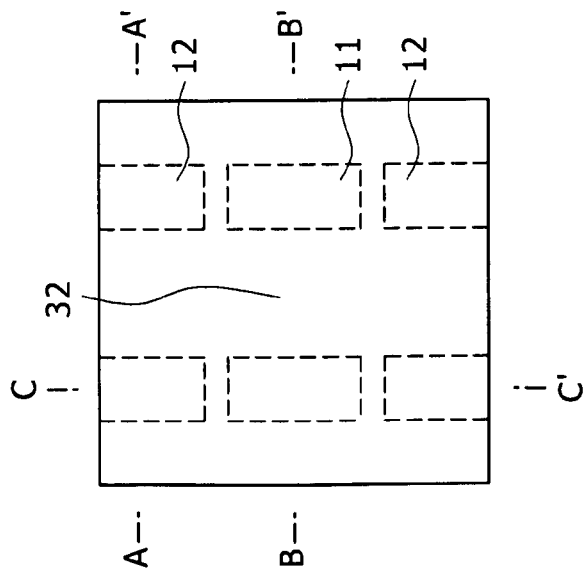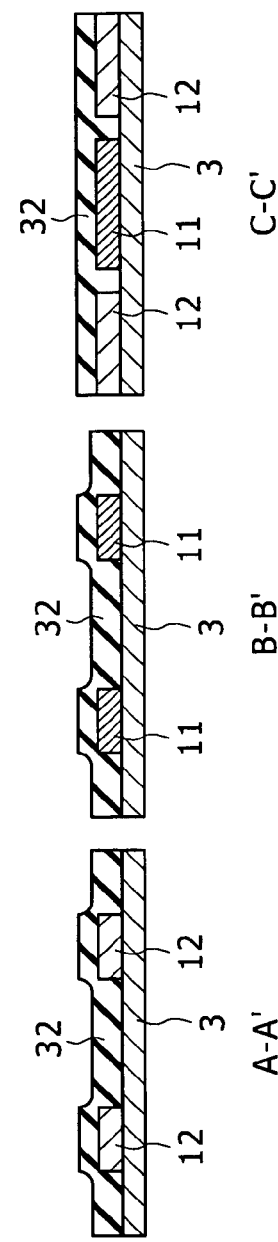

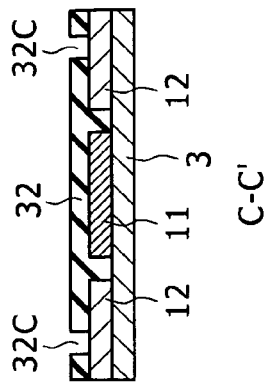
FIG. 5D  C-C'
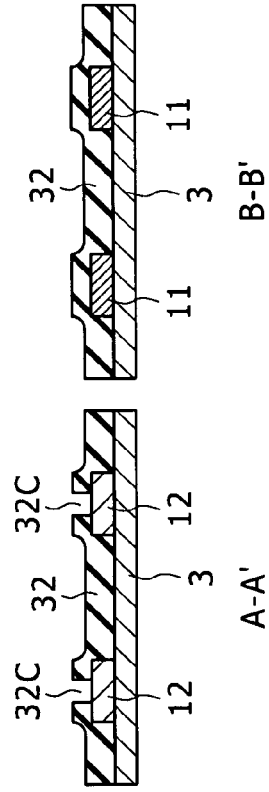
FIG. 5C  B-B'
FIG. 5B  A-A'
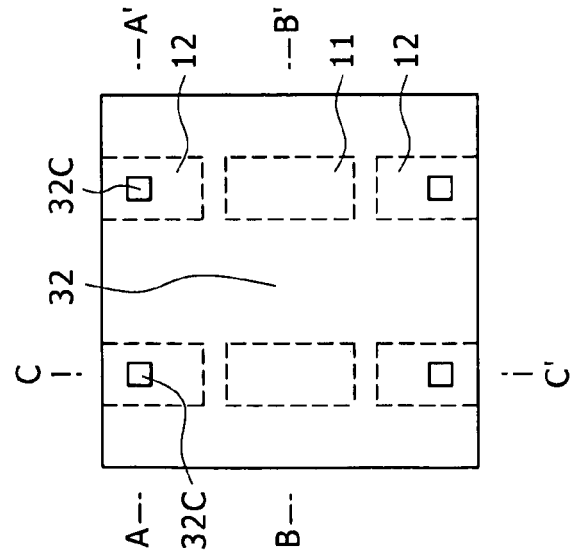
FIG. 5A

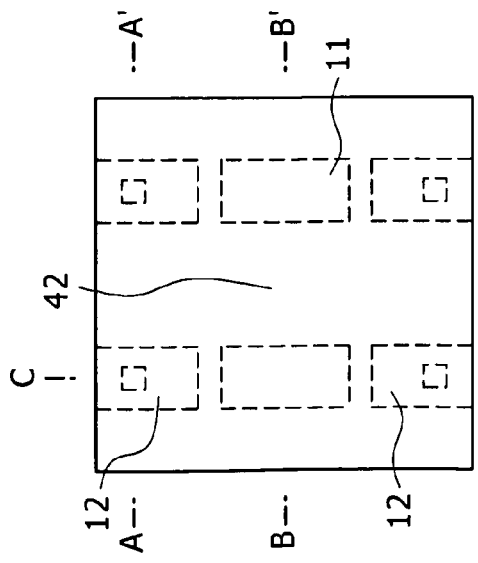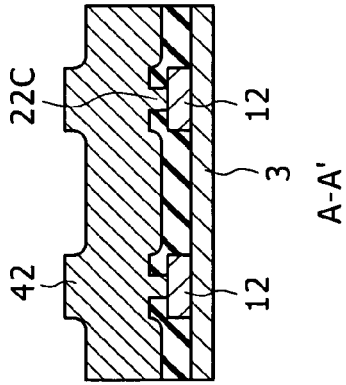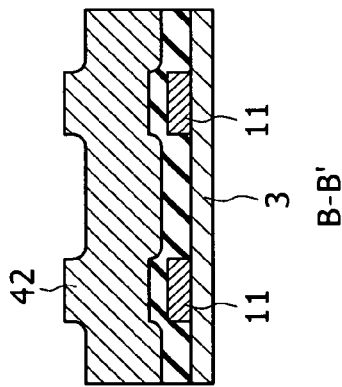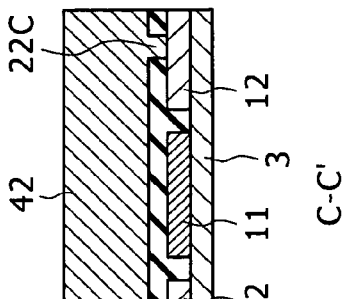

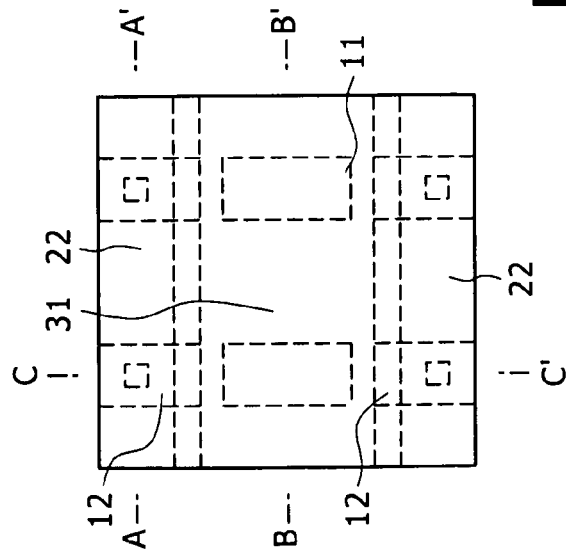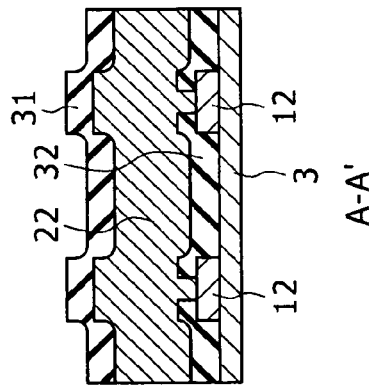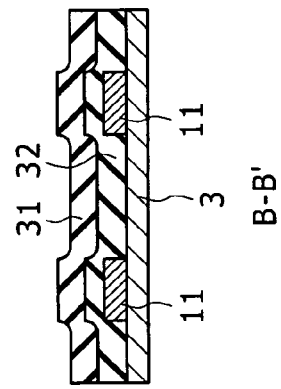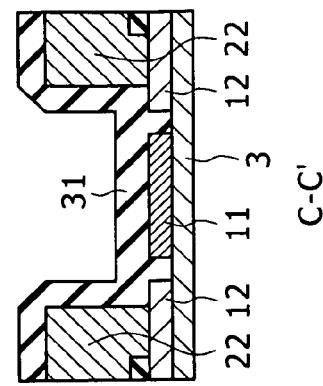

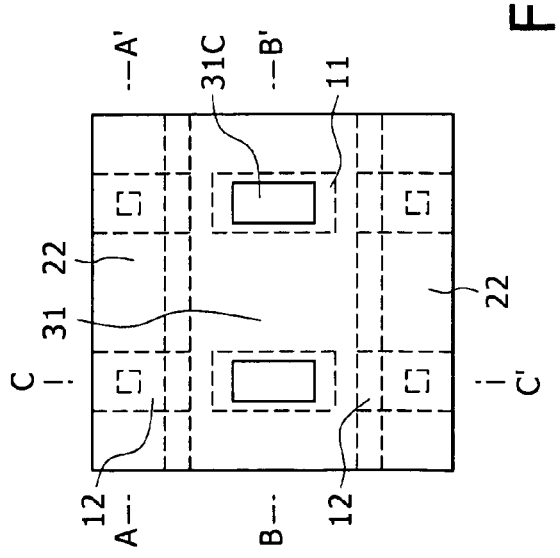
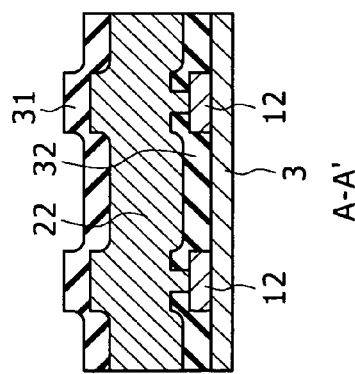
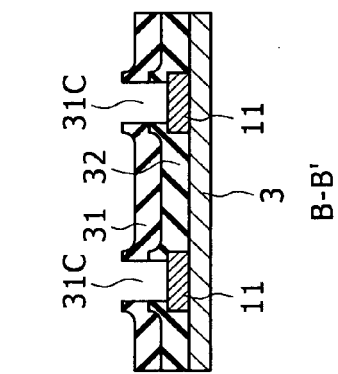
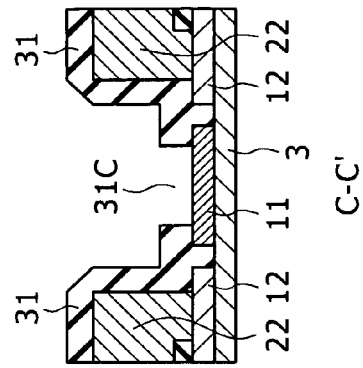
FIG.9A FIG.9B A-A' FIG.9C B-B' FIG.9D C-C'

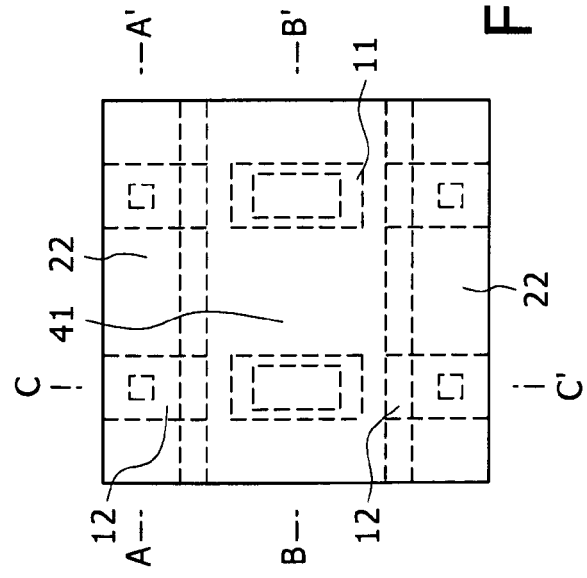
FIG.10A
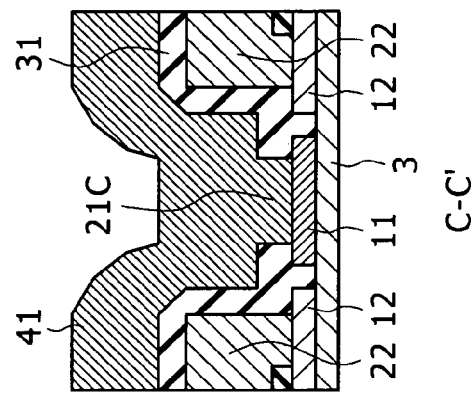
FIG.10B A-A'
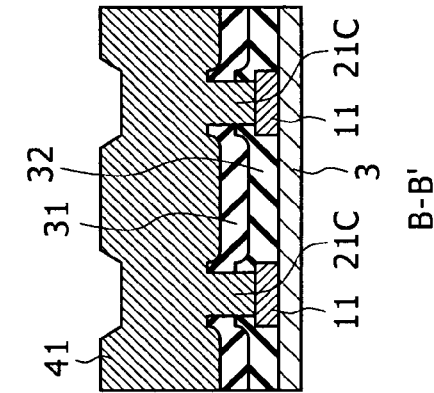
FIG.10C B-B'
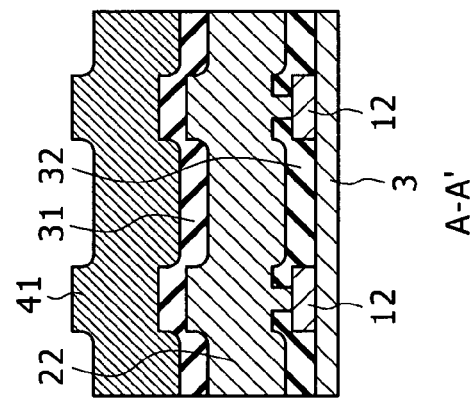
FIG.10D C-C'

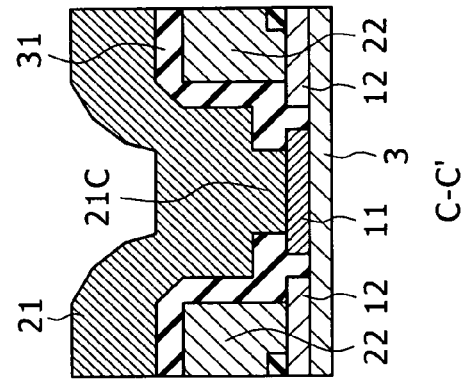
FIG.11D C-C'
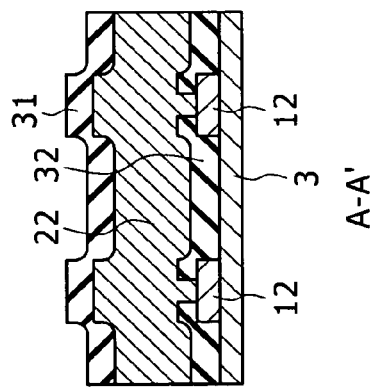
FIG.11C B-B'
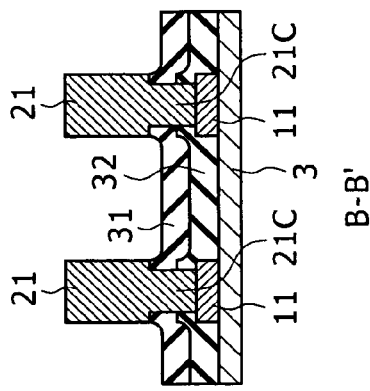
FIG.11B A-A'
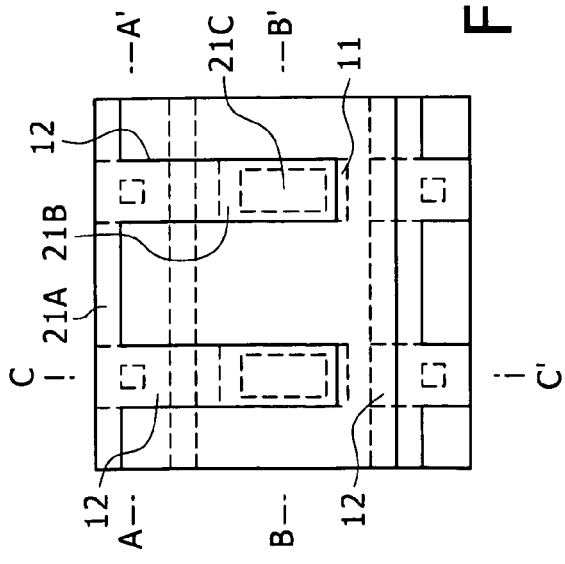
FIG.11A

FIG.15A
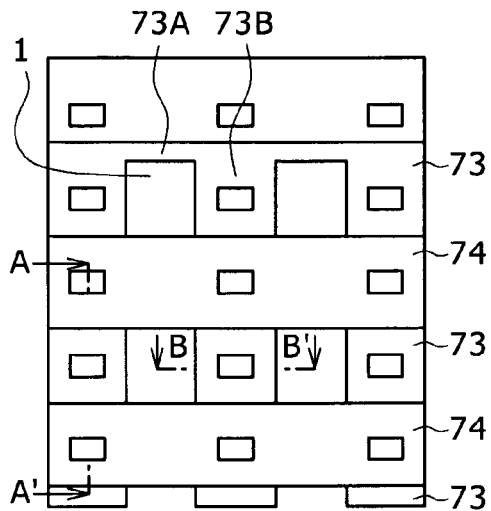
FIG.15B
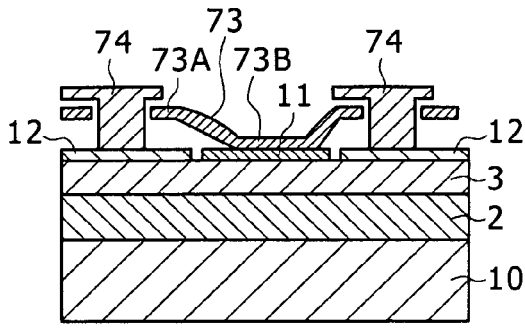
FIG.15D
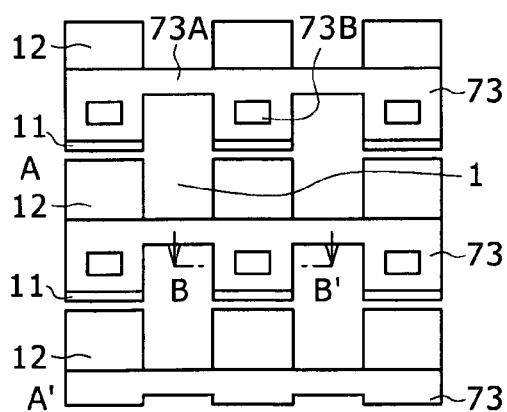
FIG.15C
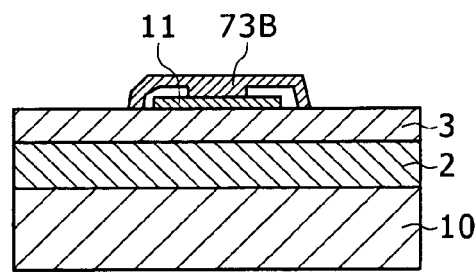
FIG.15E

FIG.16A
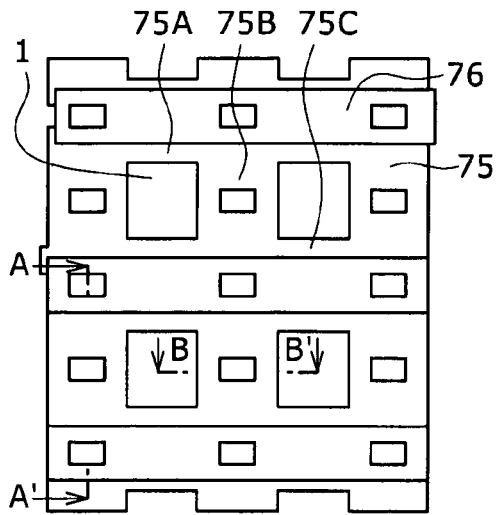
FIG.16B
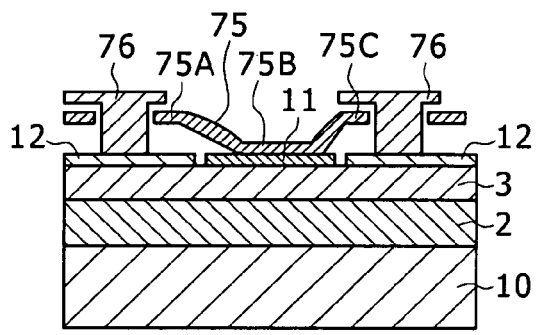
FIG.16D
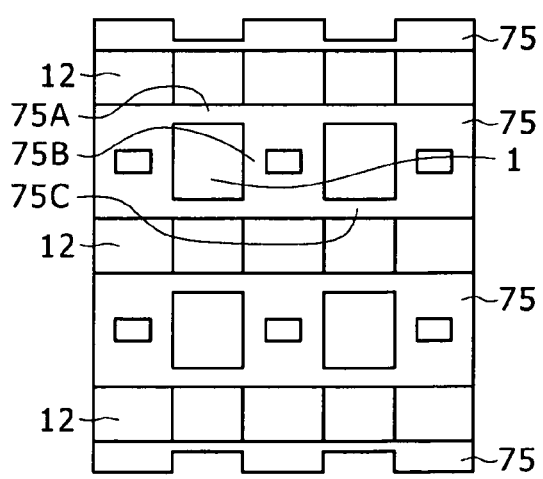
FIG.16C
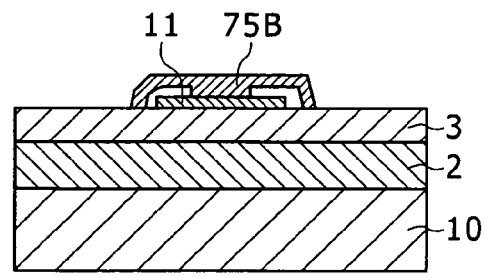
FIG.16E

SOLID-STATE IMAGE PICKUP DEVICE, METHOD OF MANUFACTURING SOLID-STATE IMAGE PICKUP DEVICE, AND IMAGE PICKUP DEVICE

CROSS REFERENCES TO RELATED APPLICATIONS

The present invention contains subject matter related to Japanese Patent Application JP 2007-251434 filed in the Japan Patent Office on Sep. 27, 2007, the entire contents of which being incorporated herein by reference.

BACKGROUND OF THE INVENTION

1. Field of the Invention

The present invention relates to a CCD (Charge Coupled Device) type solid-state image pickup device and a method of manufacturing the same, and an image pickup device.

2. Description of the Related Art

Progress is being made in increasing an angle of view of the CCD type solid-state image pickup device and in miniaturization of pixels of the CCD type solid-state image pickup device. The opening area of light receiving units of the pixels is decreased, so that to improve the sensitivity characteristics of the pixels is a great challenge.

The CCD type solid-state image pickup device has a plurality of light receiving units arranged in the form of a matrix. A transfer channel and a plurality of transfer electrodes for reading a signal charge accumulated in a light receiving unit and transferring the signal charge in a vertical direction are provided between light receiving units adjacent to each other in a horizontal direction. The transfer electrodes are coupled to each other by wiring passing in the horizontal direction over a part between light receiving units in the vertical direction. Because the transfer electrodes themselves block light incident on the light receiving units and thereby cause a decrease in sensitivity of the pixels, a structure for reducing the thickness or projection parts of transfer electrodes has been proposed.

As a structure for reducing the projection parts, a so-called single-layer type transfer electrode structure in which all transfer electrodes are formed by one-time formation of film of polysilicon has been proposed instead of a conventional vertical CCD structure in the past in which transfer electrodes are formed by two layers or three layers of polysilicon which is disclosed in Japanese Patent Laid-Open No. 2003-60819, for example.

SUMMARY OF THE INVENTION

However, the blockage (shading) of incident light cannot be reduced sufficiently with only the known single-layer transfer electrode structure, so that provisions cannot be made for a large-angle-of-view CCD, a high-speed CCD or the like.

FIGS. 26A, 26B, and 26C are diagrams showing an example of a solid-state image pickup device in the past. FIG. 26A is a plan view, FIG. 26B is a sectional view taken along the line A-A' of FIG. 26A, and FIG. 26C is a diagram of assistance in explaining a part of transfer electrodes in FIG. 26A.

The solid-state image pickup device is an example of a four-phase driving CCD. As shown in FIG. 26A to 26C, the solid-state image pickup device has a plurality of light receiving units 101 arranged in the form of a matrix in a horizontal direction and a vertical direction. The light receiving units 101 are formed of a photodiode. The light receiving units 101 accumulate a signal charge corresponding to an amount of incident light. A transfer channel 102 extending in the vertical direction is provided in an upper layer part of a semiconductor substrate 100 adjacent to light receiving units 101 in the horizontal direction.

A gate oxide film 103 is formed on the transfer channel 102. A first transfer electrode 111 and a second transfer electrode 112 are formed on the gate oxide film 103. The first transfer electrode 111 is disposed in the form of a floating island (isolated and separated) above the transfer channel 102 adjacent in the horizontal direction to a central part 101A in the vertical direction of a light receiving unit 101.

The second transfer electrode 112 is provided above the transfer channel 102 adjacent in the horizontal direction to a central part 101B between light receiving units 101 in the vertical direction, in a state of being coupled to a second transfer electrode 112 in another column by a coupling part 112A. Second transfer electrodes 112 are coupled to each other in each row in the horizontal direction by coupling parts 112A, and serve also as second wiring (that couples the second transfer electrodes 112 in the horizontal direction).

First transfer electrodes 111 are coupled to each other in each row in the horizontal direction by first wiring 121 formed in a layer above the first transfer electrodes 111 and the second transfer electrodes 112. The first wiring 121 includes a horizontal part 121A extending in the horizontal direction in the layer above the second transfer electrodes 112 and a branch part 121B extending from the horizontal part 121A above the transfer channel 102 in the vertical direction. The branch part 121B is connected to the first transfer electrode 111 via a contact part 121C under the branch part 121B.

This solid-state image pickup device is for example of a 1/2.5-inch type with 2-μm pixel unit cells. The first transfer electrodes 111, the first wiring 121, and the second transfer electrodes 112 are generally made of polysilicon. The wiring width of the first wiring 121 and the second transfer electrodes 112 (second wiring) is about 300 nm. The film thickness of each of the first transfer electrodes 111, the first wiring 121, and the second transfer electrodes 112 is about 200 nm, from a viewpoint of reducing shading of light. The height of the first wiring 121 from the gate oxide film 103 is about 450 nm, for example, as shown in FIG. 21B. The light receiving unit 101 is surrounded on four sides (in the horizontal direction and the vertical direction) by walls about 450 nm high of the first transfer electrodes 111, the first wiring 121, and the second transfer electrodes 112. The walls surrounding the light receiving unit 101 on the four sides blocks incident light obliquely entering the light receiving unit 101, thus decreasing the sensitivity of the light receiving unit 101.

The present invention has been made in view of such a situation. It is desirable to provide a solid-state image pickup device, a method of manufacturing the solid-state image pickup device, and an image pickup device that reduce the blockage (shading) of light incident from an oblique angle in the horizontal direction of the light receiving unit to thereby improve the sensitivity of the light receiving unit, and which make it possible to achieve a larger angle of view and driving at higher speed.

According to an embodiment of the present invention there is provided a solid-state image pickup device including:

a plurality of light receiving units arranged in a form of a matrix in a horizontal direction and a vertical direction;

a transfer channel in a plurality of columns for transferring a signal charge accumulated in the light receiving units in the vertical direction;

a first transfer electrode for reading a signal charge accumulated in the light receiving unit and transferring the signal charge in the vertical direction, the first transfer electrode being disposed above the transfer channel adjacent to a central part in the vertical direction of the light receiving unit;

a second transfer electrode for transferring the signal charge transferred by the first transfer electrode in the vertical direction, the second transfer electrode being disposed above the transfer channel in a same layer as the first transfer electrode;

first wiring for coupling the first transfer electrodes in a same row of the matrix to each other in the horizontal direction; and second wiring for coupling the second transfer electrodes in a same row of the matrix to each other in the horizontal direction;

wherein film thickness of the first transfer electrode and the second transfer electrode is smaller than film thickness of the first wiring and the second wiring when the first wiring and the second wiring are formed by polysilicon, the second wiring is disposed on the second transfer electrode, the first wiring includes a horizontal part disposed in a layer above the second wiring and extending in the horizontal direction and a branch part extending from the horizontal part in a form of a branch in the vertical direction and extending on the first transfer electrode, and the branch part is bent from the horizontal part toward the first transfer electrode and extends on the first transfer electrode such that a space of a transparent interlayer insulating film is formed over the branch part extending on the first transfer electrode.

According to another embodiment of the present invention there is provided a method of manufacturing a solid-state image pickup device, the method including the steps of:

forming, on a semiconductor substrate, a plurality of light receiving units arranged in a form of a matrix in a horizontal direction and a vertical direction and a transfer channel in a plurality of columns for transferring a signal charge accumulated in the light receiving units in the vertical direction;

forming a first transfer electrode for reading a signal charge accumulated in the light receiving unit and transferring the signal charge in the vertical direction above the transfer channel adjacent to a central part in the vertical direction of the light receiving unit, and simultaneously forming a second transfer electrode for transferring the signal charge transferred by the first transfer electrode in the vertical direction above the transfer channel in a same layer as the first transfer electrode;

forming second wiring for coupling the second transfer electrodes in a same row of the matrix to each other in the horizontal direction; and forming first wiring for coupling the first transfer electrodes in a same row of the matrix to each other in the horizontal direction;

wherein the transfer electrode forming step forms the first transfer electrode and the second transfer electrode such that film thickness of the first transfer electrode and the second transfer electrode is smaller than film thickness of the first wiring and the second wiring when the first wiring and the second wiring are formed by polysilicon, the second wiring is formed on the second transfer electrode, the first wiring is formed with a horizontal part disposed in a layer above the second wiring and extending in the horizontal direction and a branch part extending from the horizontal part in a form of a branch in the vertical direction and extending on the first transfer electrode, and the branch part is formed so as to be bent from the horizontal part toward the first transfer electrode and extend on the first transfer electrode such that a space of a transparent interlayer insulating film is formed over the branch part extending on the first transfer electrode.

According to still another embodiment of the present invention there is provided a solid-state image pickup device including:

a plurality of light receiving units arranged in a form of a matrix in a horizontal direction and a vertical direction;

a transfer channel in a plurality of columns for transferring a signal charge accumulated in the light receiving units in the vertical direction;

a first transfer electrode for reading a signal charge accumulated in the light receiving unit and transferring the signal charge in the vertical direction, the first transfer electrode being disposed above the transfer channel adjacent to a central part in the vertical direction of the light receiving unit;

a second transfer electrode for transferring the signal charge transferred by the first transfer electrode in the vertical direction, the second transfer electrode being disposed above the transfer channel in a same layer as the first transfer electrode;

first wiring for coupling the first transfer electrodes in a same row of the matrix to each other in the horizontal direction; and second wiring for coupling the second transfer electrodes in a same row of the matrix to each other in the horizontal direction, the second wiring being formed by a same layer as the first wiring;

wherein film thickness of the first transfer electrode and the second transfer electrode is smaller than film thickness of the first wiring and the second wiring when the first wiring and the second wiring are formed by polysilicon, the second wiring is disposed on the second transfer electrode, the first wiring includes a horizontal part extending in the horizontal direction in proximity to the second wiring and a branch part extending from the horizontal part in a form of a branch in the vertical direction and extending on the first transfer electrode, and the branch part is connected to the first transfer electrode via a contact.

According to yet another embodiment of the present invention there is provided a method of manufacturing a solid-state image pickup device, the method including the steps of:

forming, on a semiconductor substrate, a plurality of light receiving units arranged in a form of a matrix in a horizontal direction and a vertical direction and a transfer channel in a plurality of columns for transferring a signal charge accumulated in the light receiving units in the vertical direction;

forming a first transfer electrode for reading a signal charge accumulated in the light receiving unit and transferring the signal charge in the vertical direction above the transfer channel adjacent to a central part in the vertical direction of the light receiving unit, and simultaneously forming a second transfer electrode for transferring the signal charge transferred by the first transfer electrode in the vertical direction above the transfer channel in a same layer as the first transfer electrode; and a wiring forming step of simultaneously forming first wiring for coupling the first transfer electrodes in a same row of the matrix to each other in the horizontal direction and second wiring for coupling the second transfer electrodes in a same row of the matrix to each other in the horizontal direction;

wherein the transfer electrode forming step forms the first transfer electrode and the second transfer electrode such that film thickness of the first transfer electrode and the second transfer electrode is smaller than film thickness of the first wiring and the second wiring when the first wiring and the second wiring are formed by polysilicon, the wiring forming step forms the second wiring on the second transfer electrode, and simultaneously forms the first wiring with a horizontal part extending in the horizontal direction in proximity to the second wiring and a branch part extending from the horizontal part in a form of a branch in the vertical direction and extending on the first transfer electrode, and the branch part is connected to the first transfer electrode via a contact.

According to yet another embodiment of the present invention there is provided a solid-state image pickup device including:

a plurality of light receiving units arranged in a form of a matrix in a horizontal direction and a vertical direction;

a transfer channel in a plurality of columns for transferring a signal charge accumulated in the light receiving units in the vertical direction;

a first transfer electrode for reading a signal charge accumulated in the light receiving unit and transferring the signal charge in the vertical direction, the first transfer electrode being disposed above the transfer channel adjacent to a central part in the vertical direction of the light receiving unit;

a second transfer electrode for transferring the signal charge transferred by the first transfer electrode in the vertical direction, the second transfer electrode being disposed above the transfer channel in a same layer as the first transfer electrode;

a third transfer electrode for transferring the signal charge transferred by the second transfer electrode in the vertical direction, the third transfer electrode being disposed above the transfer channel in the same layer as the first transfer electrode;

first wiring for coupling the first transfer electrodes in a same row of the matrix to each other in the horizontal direction;

second wiring for coupling the second transfer electrodes in a same row of the matrix to each other in the horizontal direction; and third wiring for coupling the third transfer electrodes in a same row of the matrix to each other in the horizontal direction;

wherein film thickness of the first transfer electrode, the second transfer electrode, and the third transfer electrode is smaller than film thickness of the first wiring, the second wiring, and the third wiring when the first wiring, the second wiring, and the third wiring are formed by polysilicon, the second wiring is disposed on the second transfer electrode, the third wiring is disposed on the third transfer electrode in a same layer as the second wiring, the first wiring includes a horizontal part disposed in a layer above the second wiring and the third wiring and extending in the horizontal direction and a branch part extending from the horizontal part in a form of a branch in the vertical direction and extending on the first transfer electrode, and the branch part is bent from the horizontal part toward the first transfer electrode and extends on the first transfer electrode such that a space of a transparent interlayer insulating film is formed over the branch part extending on the first transfer electrode.

According to yet another embodiment of the present invention there is provided a method of manufacturing a solid-state image pickup device, the method including the steps of:

forming, on a semiconductor substrate, a plurality of light receiving units arranged in a form of a matrix in a horizontal direction and a vertical direction and a transfer channel in a plurality of columns for transferring a signal charge accumulated in the light receiving units in the vertical direction;

forming a first transfer electrode for reading a signal charge accumulated in the light receiving unit and transferring the signal charge in the vertical direction above the transfer channel adjacent to a central part in the vertical direction of the light receiving unit, and simultaneously forming a second transfer electrode for transferring the signal charge transferred by the first transfer electrode in the vertical direction and a third transfer electrode for transferring the signal charge transferred by the second transfer electrode in the vertical direction above the transfer channel in a same layer as the first transfer electrode;

simultaneously forming second wiring for coupling the second transfer electrodes in a same row of the matrix to each other in the horizontal direction and third wiring for coupling the third transfer electrodes in a same row of the matrix to each other in the horizontal direction; and forming first wiring for coupling the first transfer electrodes in a same row of the matrix to each other in the horizontal direction;

wherein the transfer electrode forming step forms the first transfer electrode, the second transfer electrode, and the third transfer electrode such that film thickness of the first transfer electrode, the second transfer electrode, and the third transfer electrode is smaller than film thickness of the first wiring, the second wiring, and the third wiring when the first wiring, the second wiring, and the third wiring are formed by polysilicon, the second wiring is formed on the second transfer electrode and the third wiring is formed on the third transfer electrode, the first wiring is formed with a horizontal part disposed in a layer above the second wiring and the third wiring and extending in the horizontal direction and a branch part extending from the horizontal part in a form of a branch in the vertical direction and extending on the first transfer electrode, and the branch part is formed so as to be bent from the horizontal part toward the first transfer electrode and extend on the first transfer electrode such that a space of a transparent interlayer insulating film is formed over the branch part extending on the first transfer electrode.

According to yet another embodiment of the present invention there is provided a solid-state image pickup device including:

a plurality of light receiving units arranged in a form of a matrix in a horizontal direction and a vertical direction;

a transfer channel in a plurality of columns for transferring a signal charge accumulated in the light receiving units in the vertical direction;

a first transfer electrode for reading a signal charge accumulated in the light receiving unit and transferring the signal charge in the vertical direction, the first transfer electrode being disposed above the transfer channel adjacent to a central part in the vertical direction of the light receiving unit;

a second transfer electrode for transferring the signal charge transferred by the first transfer electrode in the vertical direction, the second transfer electrode being disposed above the transfer channel in a same layer as the first transfer electrode;

a third transfer electrode for transferring the signal charge transferred by the second transfer electrode in the vertical direction, the third transfer electrode being disposed above the transfer channel in the same layer as the first transfer electrode;

first wiring for coupling the first transfer electrodes in a same row of the matrix to each other in the horizontal direction;

second wiring for coupling the second transfer electrodes in a same row of the matrix to each other in the horizontal direction; and third wiring for coupling the third transfer electrodes in a same row of the matrix to each other in the horizontal direction;

wherein film thickness of the first transfer electrode, the second transfer electrode, and the third transfer electrode is smaller than film thickness of the first wiring, the second wiring, and the third wiring when the first wiring, the second wiring, and the third wiring are formed by polysilicon, the second wiring is disposed on the second transfer electrode, the first wiring includes a first horizontal part disposed in a layer above the second wiring and extending in the horizontal direction and a first branch part extending from the first horizontal part in a form of a branch in the vertical direction and extending on the first transfer electrode, the third wiring includes a third horizontal part disposed in a same layer as the first wiring and extending in the horizontal direction and a third branch part extending from the third horizontal part in a form of a branch in the vertical direction and extending on the third transfer electrode, and the first branch part is bent from the first horizontal part toward the first transfer electrode and extends on the first transfer electrode such that a space of a transparent interlayer insulating film is formed over the first branch part extending on the first transfer electrode.

According to yet another embodiment of the present invention there is provided a method of manufacturing a solid-state image pickup device, the method including the steps of:

forming, on a semiconductor substrate, a plurality of light receiving units arranged in a form of a matrix in a horizontal direction and a vertical direction and a transfer channel in a plurality of columns for transferring a signal charge accumulated in the light receiving units in the vertical direction;

forming a first transfer electrode for reading a signal charge accumulated in the light receiving unit and transferring the signal charge in the vertical direction above the transfer channel adjacent to a central part in the vertical direction of the light receiving unit, and simultaneously forming a second transfer electrode for transferring the signal charge transferred by the first transfer electrode in the vertical direction and a third transfer electrode for transferring the signal charge transferred by the second transfer electrode in the vertical direction above the transfer channel in a same layer as the first transfer electrode;

a first wiring forming step of forming second wiring for coupling the second transfer electrodes in a same row of the matrix to each other in the horizontal direction; and a second wiring forming step of simultaneously forming first wiring for coupling the first transfer electrodes in a same row of the matrix to each other in the horizontal direction and third wiring for coupling the third transfer electrodes in a same row of the matrix to each other in the horizontal direction;

wherein the transfer electrode forming step forms the first transfer electrode, the second transfer electrode, and the third transfer electrode such that film thickness of the first transfer electrode, the second transfer electrode, and the third transfer electrode is smaller than film thickness of the first wiring, the second wiring, and the third wiring when the first wiring, the second wiring, and the third wiring are formed by polysilicon, the second wiring is formed on the second transfer electrode, the first wiring is formed with a first horizontal part disposed in a layer above the second wiring and extending in the horizontal direction and a first branch part extending from the first horizontal part in a form of a branch in the vertical direction and extending on the first transfer electrode, and the third wiring is formed with a third horizontal part disposed in a same layer as the first wiring and extending in the horizontal direction and a third branch part extending from the third horizontal part in a form of a branch in the vertical direction and extending on the third transfer electrode, and the first branch part is formed so as to be bent from the horizontal part toward the first transfer electrode and extend on the first transfer electrode such that a space of a transparent interlayer insulating film is formed over the first branch part extending on the first transfer electrode.

According to yet another embodiment of the present invention there is provided a image pickup device including:

an image pickup unit using a solid-state image pickup device;

a control unit for configured to control the image pickup unit; and an operating unit configured to operate the image pickup unit;

wherein the solid-state image pickup device includes a plurality of light receiving units arranged in a form of a matrix in a horizontal direction and a vertical direction, a transfer channel in a plurality of columns for transferring a signal charge accumulated in the light receiving units in the vertical direction, a first transfer electrode for reading a signal charge accumulated in the light receiving unit and transferring the signal charge in the vertical direction, the first transfer electrode being disposed above the transfer channel adjacent to a central part in the vertical direction of the light receiving unit, a second transfer electrode for transferring the signal charge transferred by the first transfer electrode in the vertical direction, the second transfer electrode being disposed above the transfer channel in a same layer as the first transfer electrode, first wiring for coupling the first transfer electrodes in a same row of the matrix to each other in the horizontal direction, and second wiring for coupling the second transfer electrodes in a same row of the matrix to each other in the horizontal direction, and film thickness of the first transfer electrode and the second transfer electrode is smaller than film thickness of the first wiring and the second wiring when the first wiring and the second wiring are formed by polysilicon, the second wiring is disposed on the second transfer electrode, the first wiring includes a horizontal part disposed in a layer above the second wiring and extending in the horizontal direction and a branch part extending from the horizontal part in a form of a branch in the vertical direction and extending on the first transfer electrode, and the branch part is bent from the horizontal part toward the first transfer electrode and extends on the first transfer electrode such that a space of a transparent interlayer insulating film is formed over the branch part extending on the first transfer electrode.

According to yet another embodiment of the present invention there is provided a solid-state image pickup device including:

a plurality of light receiving units arranged in a form of a matrix in a horizontal direction and a vertical direction;

a transfer channel in a plurality of columns for transferring a signal charge accumulated in the light receiving units in the vertical direction;

a first transfer electrode for reading a signal charge accumulated in the light receiving unit and transferring the signal charge in the vertical direction, the first transfer electrode being disposed above the transfer channel adjacent to a central part in the vertical direction of the light receiving unit;

a second transfer electrode for transferring the signal charge transferred by the first transfer electrode in the vertical direction, the second transfer electrode being disposed above the transfer channel in a same layer as the first transfer electrode;

first wiring for coupling the first transfer electrodes in a same row of the matrix to each other in the horizontal direction; and second wiring for coupling the second transfer electrodes in a same row of the matrix to each other in the horizontal direction;

wherein film thickness of the first transfer electrode and the second transfer electrode is smaller than film thickness of the first wiring and the second wiring when the first wiring and the second wiring are formed by polysilicon, the second wiring is disposed on the second transfer electrode, the first wiring includes a first horizontal part disposed in proximity to the second wiring in one of the same row and an adjacent row and extending in the horizontal direction and a first branch part extending from the first horizontal part in a form of a branch in the vertical direction and extending on the first transfer electrode, the first branch part is bent from the first horizontal part toward the first transfer electrode and extends on the first transfer electrode such that a space of a transparent interlayer insulating film is formed over the first branch part extending on the first transfer electrode, and the first wiring and the second wiring are each made of a metal, are formed so as to cover the first transfer electrode and the second transfer electrode, and serve also as a light shielding film forming an opening of the light receiving unit.

According to the solid-state image pickup device, the method of manufacturing the solid-state image pickup device, and the image pickup device according to the above-described embodiments of the present invention, the first transfer electrode and the second transfer electrode are formed with a film thickness smaller than film thickness of the first wiring and the second wiring when the first wiring and the second wiring are formed by polysilicon. The second wiring is disposed on the second transfer electrode. The first wiring includes a horizontal part disposed in a layer above the second wiring and extending in the horizontal direction and a branch part extending from the horizontal part in a form of a branch in the vertical direction and extending on the first transfer electrode. The branch part is bent from the horizontal part toward the first transfer electrode and extends on the first transfer electrode such that a space of a transparent interlayer insulating film is formed on the first wiring extending on the first transfer electrode.

Thus, a space of a transparent interlayer insulating film can be formed in a part that is at a same height as the horizontal part of the first wiring and which is on the branch part of the first wiring on the first transfer electrode. It is thus possible to reduce the blockage of light incident on the light receiving unit from an oblique angle in the horizontal direction. Therefore, the sensitivity of the light receiving unit can be improved. Because the light receiving unit of a CCD is generally formed in a rectangular shape that is long in the vertical direction, there is a small decrease in sensitivity even when light is incident from a wide angle in the vertical direction. On the other hand, light from a wide angle in the horizontal direction greatly affects the sensitivity. Reducing the blockage of incident light in the horizontal direction as in the present invention greatly contributes to an improvement in sensitivity of the light receiving unit.

In addition, the first transfer electrode and the second transfer electrode are formed with a film thickness smaller than film thickness of the first wiring and the second wiring when the first wiring and the second wiring are formed by polysilicon. Because of the small film thickness of the first transfer electrode and the second transfer electrode, it is easy to fill in a part between the first transfer electrode and the second transfer electrode by an interlayer insulating film. An interval between the first transfer electrode and the second transfer electrode can thus be reduced as much as possible. Thereby, the respective areas of the first transfer electrode and the second transfer electrode can be increased. It is therefore possible to improve the capacitor capacitance of the first transfer electrode and the second transfer electrode, and thereby transfer more electrons.

In addition, because of the small film thickness of the first transfer electrode and the second transfer electrode, the opposed areas of the first transfer electrode and the second transfer electrode are reduced. Hence, a capacitance between the first transfer electrode and the second transfer electrode can be reduced, thus decreasing an RC time constant and enabling high-speed driving.

In addition, according to the solid-state image pickup device and the method of manufacturing the solid-state image pickup device according to the above-described embodiments of the present invention, the first transfer electrode and the second transfer electrode are formed with a film thickness smaller than film thickness of the first wiring and the second wiring when the first wiring and the second wiring are formed by polysilicon. The second wiring is disposed on the second transfer electrode. The first wiring includes a horizontal part extending in the horizontal direction in proximity to the second wiring and a branch part extending from the horizontal part in a form of a branch in the vertical direction and extending on the first transfer electrode. The branch part is connected to the first transfer electrode via a contact.

Thus, although an opening in the vertical direction of the light receiving unit is shortened, the first wiring and the second wiring can be formed at a same height in a same layer, and therefore the height of walls surrounding the light receiving unit on four sides (in the horizontal direction and the vertical direction) can be decreased. Hence, it is possible to reduce the blockage of light incident on the light receiving unit at a wide angle, and thereby improve the sensitivity of the light receiving unit. Moreover, because the first wiring and the second wiring can be formed in the same layer, the number of processes can be reduced.

In addition, according to the solid-state image pickup device and the method of manufacturing the solid-state image pickup device according to the above-described embodiments of the present invention, the first transfer electrode, the second transfer electrode, and the third transfer electrode are formed with a film thickness smaller than film thickness of the first wiring, the second wiring, and the third wiring when the first wiring, the second wiring, and the third wiring are formed by polysilicon. The second wiring is disposed on the second transfer electrode. The third wiring is disposed on the third transfer electrode. The first wiring includes a horizontal part disposed in a layer above the second wiring and the third wiring and extending in the horizontal direction and a branch part extending from the horizontal part in a form of a branch in the vertical direction and extending on the first transfer electrode. The branch part is bent from the horizontal part toward the first transfer electrode and extends on the first transfer electrode such that a space of a transparent interlayer insulating film is formed on the first wiring extending on the first transfer electrode.

Thus, a space of a transparent interlayer insulating film can be formed in a part that is at a same height as the horizontal part of the first wiring and which is on the branch part of the first wiring on the first transfer electrode. It is thus possible to reduce the blockage of light incident on the light receiving unit from an oblique angle in the horizontal direction. Therefore, the sensitivity of the light receiving unit can be improved.

In addition, according to the solid-state image pickup device and the method of manufacturing the solid-state image pickup device according to the above-described embodiments of the present invention, the first transfer electrode, the second transfer electrode, and the third transfer electrode are formed with a film thickness smaller than film thickness of the first wiring, the second wiring, and the third wiring when the first wiring, the second wiring, and the third wiring are formed by polysilicon. The second wiring is disposed on the second transfer electrode. The first wiring includes a first horizontal part disposed in a layer above the second wiring and the third wiring and extending in the horizontal direction and a branch part extending from the first horizontal part in a form of a branch in the vertical direction and extending on the first transfer electrode. The branch part is bent from the first horizontal part toward the first transfer electrode and extends on the first transfer electrode such that a space of a transparent interlayer insulating film is formed over the first wiring extending on the first transfer electrode. The third wiring includes a third horizontal part disposed in a same layer as the first wiring and extending in the horizontal direction and a third branch part extending from the third horizontal part in a form of a branch in the vertical direction and extending on the third transfer electrode.

Thus, a space of a transparent interlayer insulating film can be formed in a part that is at a same height as the horizontal part of the first wiring and which is on the branch part of the first wiring on the first transfer electrode. It is thus possible to reduce the blockage of light incident on the light receiving unit from an oblique angle in the horizontal direction. Therefore, the sensitivity of the light receiving unit can be improved.

In addition, according to the solid-state image pickup device according to the above-described embodiment of the present invention, the first wiring and the second wiring serve also as a light shielding film, so that processes are reduced.

BRIEF DESCRIPTION OF THE DRAWINGS

FIGS. 3A, 3B, 3C, and 3D are diagrams illustrating a method of manufacturing the solid-state image pickup device according to the first embodiment, FIG. 3A a plan view, FIG. 3B a sectional view taken along the line A-A' of FIG. 3A, FIG. 3C a sectional view taken along the line B-B' of FIG. 3A, and FIG. 3D a sectional view taken along the line C-C' of FIG. 3A;

FIGS. 4A, 4B, 4C, and 4D are diagrams illustrating the method of manufacturing the solid-state image pickup device according to the first embodiment, FIG. 4A a plan view, FIG. 4B a sectional view taken along the line A-A' of FIG. 4A, FIG. 4C a sectional view taken along the line B-B' of FIG. 4A, and FIG. 4D a sectional view taken along the line C-C' of FIG. 4A;

FIGS. 5A, 5B, 5C, and 5D are diagrams illustrating the method of manufacturing the solid-state image pickup device according to the first embodiment, FIG. 5A a plan view, FIG. 5B a sectional view taken along the line A-A' of FIG. 5A, FIG. 5C a sectional view taken along the line B-B' of FIG. 5A, and FIG. 5D a sectional view taken along the line C-C' of FIG. 5A;

FIGS. 6A, 6B, 6C, and 6D are diagrams illustrating the method of manufacturing the solid-state image pickup device according to the first embodiment, FIG. 6A a plan view, FIG. 6B a sectional view taken along the line A-A' of FIG. 6A, FIG. 6C a sectional view taken along the line B-B' of FIG. 6A, and FIG. 6D a sectional view taken along the line C-C' of FIG. 6A;

FIGS. 8A, 8B, 8C, and 8D are diagrams illustrating the method of manufacturing the solid-state image pickup device according to the first embodiment, FIG. 8A a plan view, FIG. 8B a sectional view taken along the line A-A' of FIG. 8A, FIG. 8C a sectional view taken along the line B-B' of FIG. 8A, and FIG. 8D a sectional view taken along the line C-C' of FIG. 8A;

FIGS. 9A, 9B, 9C, and 9D are diagrams illustrating the method of manufacturing the solid-state image pickup device according to the first embodiment, FIG. 9A a plan view, FIG. 9B a sectional view taken along the line A-A' of FIG. 9A, FIG. 9C a sectional view taken along the line B-B' of FIG. 9A, and FIG. 9D a sectional view taken along the line C-C' of FIG. 9A;

FIGS. 10A, 10B, 10C, and 10D are diagrams illustrating the method of manufacturing the solid-state image pickup device according to the first embodiment, FIG. 10A a plan view, FIG. 10B a sectional view taken along the line A-A' of FIG. 10A, FIG. 10C a sectional view taken along the line B-B' of FIG. 10A, and FIG. 10D a sectional view taken along the line C-C' of FIG. 10A;

FIGS. 11A, 11B, 11C, and 11D are diagrams illustrating the method of manufacturing the solid-state image pickup device according to the first embodiment, FIG. 11A a plan view, FIG. 11B a sectional view taken along the line A-A' of FIG. 1A, FIG. 11C a sectional view taken along the line B-B' of FIG. 11A, and FIG. 11D a sectional view taken along the line C-C' of FIG. 11A;

FIGS. 15A, 15B, 15C, 15D, and 15E are diagrams showing a solid-state image pickup device according to a second example of modification of the third embodiment, FIG. 15A a plan view, FIG. 15B a sectional view taken along the line A-A' of FIG. 15A, FIG. 15C a sectional view taken along the line B-B' of FIG. 15A, FIG. 15D a diagram of assistance in explaining a part of first wiring in FIG. 15A, and FIG. 15E a diagram of assistance in explaining a part of second wiring in FIG. 15A;

FIGS. 16A, 16B, 16C, 16D, and 16E are diagrams showing a solid-state image pickup device according to a third example of modification of the third embodiment, FIG. 16A a plan view, FIG. 16B a sectional view taken along the line A-A' of FIG. 16A, FIG. 16C a sectional view taken along the line B-B' of FIG. 16A, FIG. 16D a diagram of assistance in explaining a part of first wiring in FIG. 16A, and FIG. 16E a diagram of assistance in explaining a part of second wiring in FIG. 16A;

DETAILED DESCRIPTION OF THE PREFERRED EMBODIMENTS

A solid-state image pickup device, a method of manufacturing a solid-state image pickup device, and an image pickup device according to the embodiments of the present invention will hereinafter be described with reference to the drawings.

First Embodiment

Figure 1A:
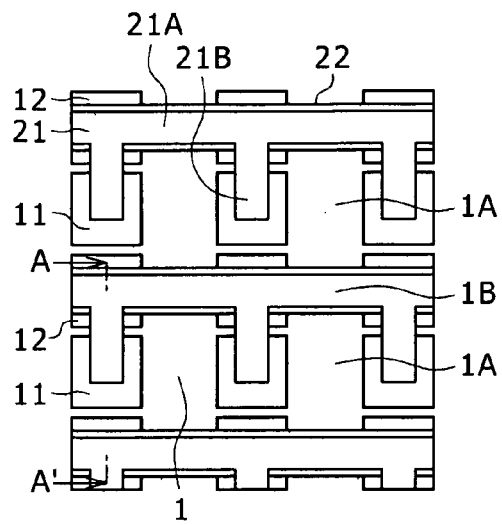
FIGS. 1A, 1B, 1C, and 1D are diagrams showing a solid-state image pickup device according to a first embodiment, FIG. 1A a plan view, FIG. 1B a sectional view taken along the line A-A' of FIG. 1A, FIG. 1C a diagram of assistance in explaining a part of transfer electrodes in FIG. 1A, and FIG. 1D being a diagram of assistance in explaining a part of second wiring in FIG. 1A.
Figure 1B:
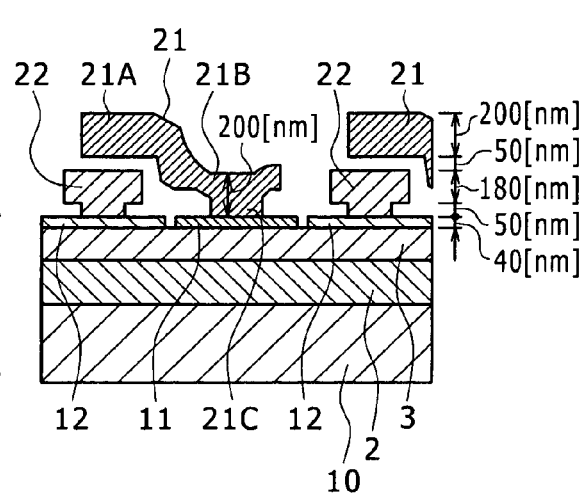
Figure 1C:
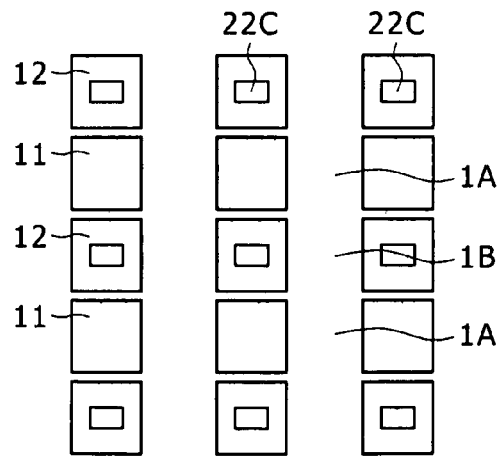
Figure 1D:
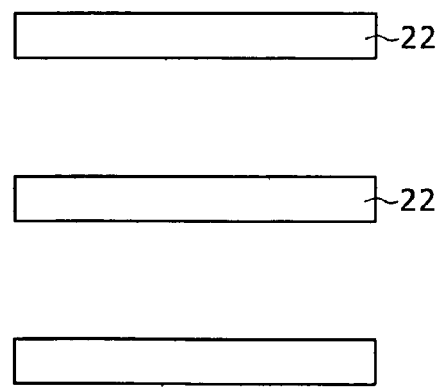

FIGS. 1A, 1B, 1C, and 1D are diagrams showing a solid-state image pickup device according to a first embodiment. FIG. 1A is a plan view, FIG. 1B is a sectional view taken along the line A-A' of FIG. 1A, FIG. 1C is a diagram of assistance in explaining a part of transfer electrodes in FIG. 1A, and FIG. 1D is a diagram of assistance in explaining a part of second wiring in FIG. 1A.

Figure 2A:
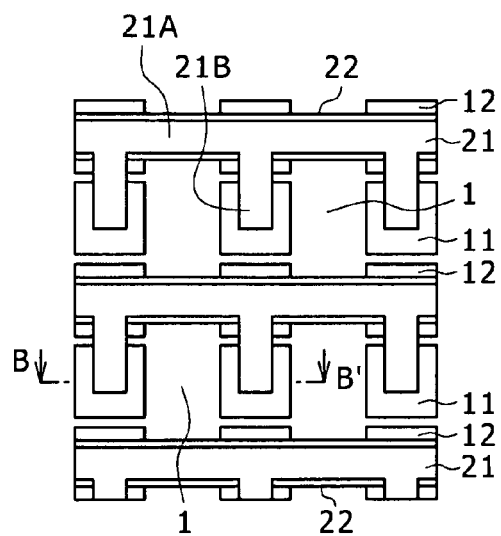
FIG. 2A is a plan view of the solid-state image pickup device according to the first embodiment which device is shown in FIGS. 1A, 1B, 1C, and 1D.
Figure 2C:
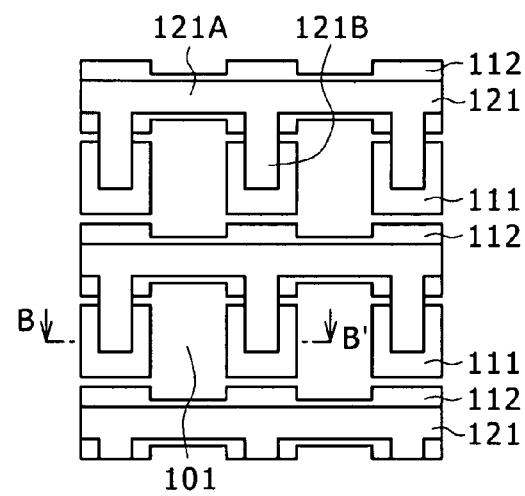
FIG. 2C is a plan view of a solid-state image pickup device in related art shown in FIGS. 26A, 26B, and 26C.
Figure 2B:
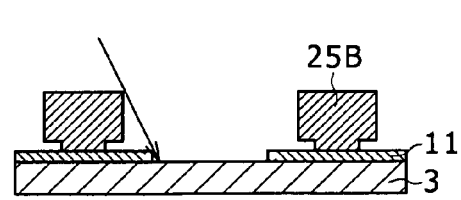
FIG. 2B is a sectional view taken along the line B-B' of FIG. 2A.
Figure 2D:
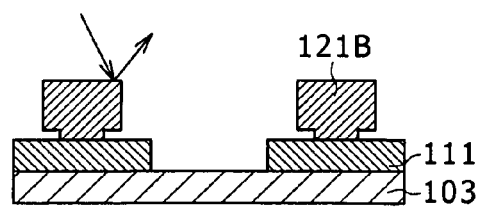
FIG. 2D is a sectional view taken along the line B-B' of FIG. 2C.
Figure 7A:
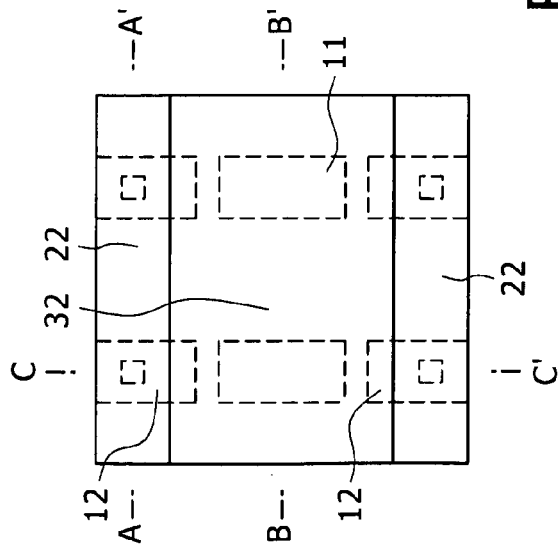
FIGS. 7A, 7B, 7C, and 7D are diagrams illustrating the method of manufacturing the solid-state image pickup device according to the first embodiment, FIG. 7A a plan view, FIG. 7B a sectional view taken along the line A-A' of FIG. 7A, FIG. 7C a sectional view taken along the line B-B' of FIG. 7A, and FIG. 7D a sectional view taken along the line C-C' of FIG. 7A.
Figure 7B:
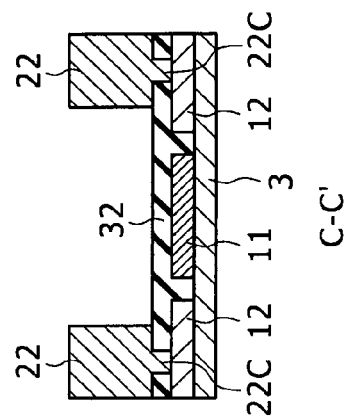
Figure 7C:
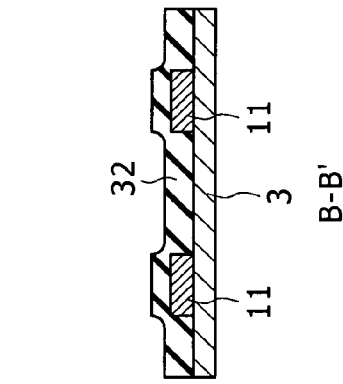
Figure 7D:
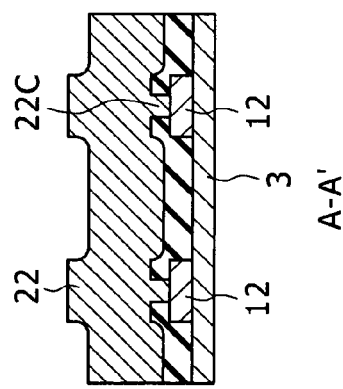
Figure 26A:
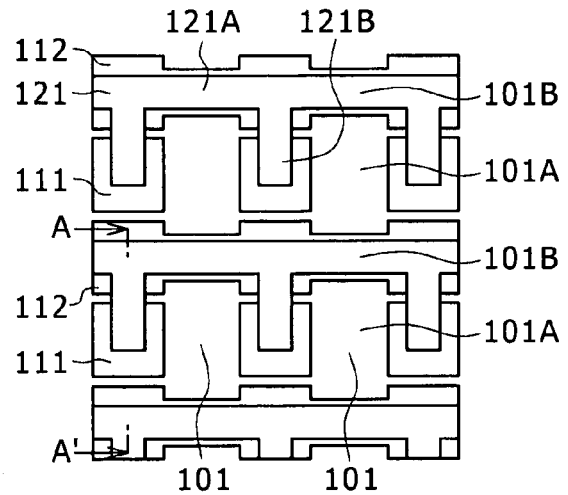
FIGS. 26A, 26B, and 26C are diagrams showing an example of a solid-state image pickup device in the past, FIG. 26A a plan view, FIG. 26B a sectional view taken along the line A-A' of FIG. 26A, and FIG. 26C a diagram of assistance in explaining a part of transfer electrodes in FIG. 26A.
Figure 26B:
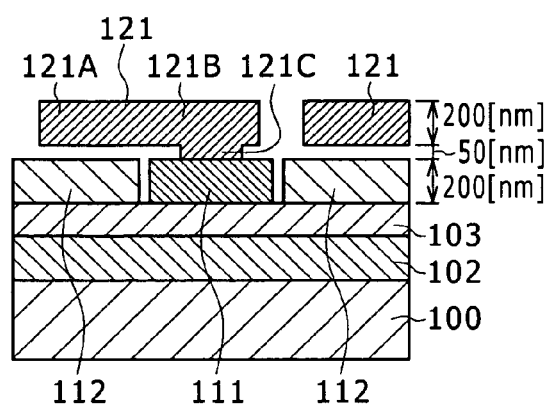
Figure 26C:
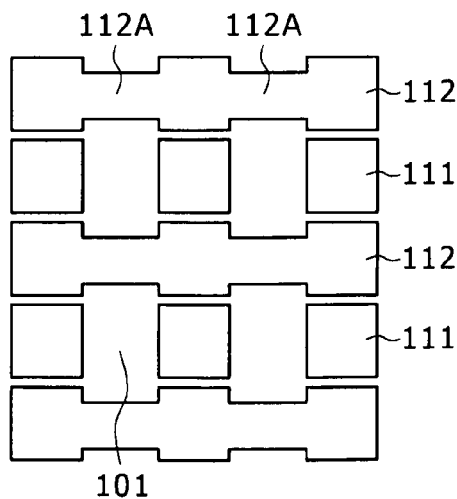

FIG. 2A is a plan view of the solid-state image pickup device according to the first embodiment which device is shown in FIGS. 1A, 1B, 1C, and 1D. FIG. 2B is a sectional view taken along the line B-B' of FIG. 2A. FIG. 2C is a plan view of the solid-state image pickup device in the past shown in FIGS. 26A, 26B, and 26C. FIG. 2D is a sectional view taken along the line B-B' of FIG. 2C.

The solid-state image pickup device is an example of a four-phase driving CCD. As shown in FIG. 1A and FIG. 2A, the solid-state image pickup device has a plurality of light receiving units 1 arranged in the form of a matrix in a horizontal direction and a vertical direction. The light receiving units 1 are formed of a photodiode. The light receiving units 1 accumulate a signal charge corresponding to an amount of incident light. A transfer channel 2 extending in the vertical direction is provided in an upper layer part of a semiconductor substrate 10 adjacent to light receiving units 1 in the horizontal direction. The transfer channel 2 is to read a signal charge accumulated in a light receiving unit 1 and transfer the signal charge in the vertical direction.

A gate oxide film 3 is formed on the transfer channel 2. A first transfer electrode 11 and a second transfer electrode 12 are formed on the gate oxide film 3. The first transfer electrode 11 is disposed above the transfer channel 2 adjacent in the horizontal direction to a central part 1A in the vertical direction of a light receiving unit 1. The second transfer electrode 12 is provided above the transfer channel 2 adjacent in the horizontal direction to a central part 1B between light receiving units 1 in the vertical direction. The first transfer electrode 11 is to read a signal charge accumulated in the light receiving unit 1 and transfer the signal charge to the second transfer electrode 12 in the vertical direction. The second transfer electrode 12 is to transfer the signal charge transferred by the first transfer electrode 11 to a first transfer electrode 11 in a next row in the vertical direction. The transfer channel 2, the first transfer electrode 11, and the second transfer electrode 12 form a so-called vertical transfer part.

Second transfer electrodes 12 are coupled to each other in each row in the horizontal direction by second wiring 22 disposed on the second transfer electrodes 12. The second wiring 22 is connected to the second transfer electrodes 12 by contact parts 22C formed under the second wiring 22.

First transfer electrodes 11 are coupled to each other in each row in the horizontal direction by first wiring 21. The first wiring 21 includes a horizontal part 21A extending in the horizontal direction in a layer above the second wiring 22 and a branch part 21B extending from the horizontal part 21A above the transfer channel 2 in the vertical direction. The branch part 21B is bent from the horizontal part 21A toward the first transfer electrode 11 and extends on the first transfer electrode 11 such that a space of a transparent interlayer insulating film not shown in the figure is formed over the branch part 21B extending on the first transfer electrode 11. The branch part 21B is connected to the first transfer electrodes 11 via contact parts 21C under the branch part 21B.

This solid-state image pickup device is for example of a 1/2.5-inch type with 2-μm pixel unit cells. The first transfer electrode 11 and the second transfer electrode 12 are made of polysilicon. The first transfer electrode 11 and the second transfer electrode 12 are formed with a film thickness of about 40 nm, for example, from a viewpoint of reducing shading of light. The first transfer electrode 11 and the second transfer electrode 12 have a so-called single-layer type electrode structure formed by one-time formation of film of polysilicon. The first wiring 21 and the second wiring 22 are each made of polysilicon. The first wiring 21 and the second wiring 22 are formed with a film thickness of about 200 nm, for example, from a viewpoint of reducing shading of light. The first transfer electrode 11 and the second transfer electrode 12, the first wiring 21, and the second wiring 22 are each formed by a separate process.

According to the first embodiment, the film thickness of the first transfer electrode 11 and the second transfer electrode 12 can be made sufficiently small as compared with the first wiring 21 and the second wiring 22. Thus, the height of the branch part 21B of the first wiring 21 from the gate oxide film 3 above the first transfer electrode 11 is 240 nm, which is a result of addition of a film thickness of 40 nm of the first transfer electrode 11 and a film thickness of 200 nm of the first wiring 21. This height is greatly reduced as compared with the height of 450 nm of the first transfer electrode 111 from the gate oxide film 103 in the conventional solid-state image pickup device in the past shown in FIGS. 26A to 26C, FIG. 2C, and FIG. 2D. It is thus possible to reduce shading of light incident from a wide angle in the horizontal direction, and thereby improve the sensitivity of the light receiving units 1.

On the other hand, the height from the gate oxide film 3 of the horizontal part 21A of the first wiring 21 formed above the second wiring 22 is 490 nm, which is a result of addition of a film thickness of 40 nm of the second transfer electrode 12, a film thickness of 200 nm of the second wiring 22, a thickness of 50 nm of the interlayer insulating film not shown in the figures, and the film thickness of 200 nm of the first wiring 21. This height is somewhat greater than the height of 450 nm of the first transfer electrode 111 from the gate oxide film 103 in the solid-state image pickup device in the past.

A solid-state image pickup device generally has a larger screen size in the horizontal direction than a screen size in the vertical direction in order to have the same screen size as a display device such as an LCD, a CRT or the like. Thus, in a solid-state image pickup device in which first wiring 21 and second wiring 22 extend in the horizontal direction, light is incident at a wider angle on pixels in an outermost region in the horizontal direction than on pixels in an outermost region in the vertical direction. A larger amount of light is shaded by transfer electrodes and wiring above the pixels in the outermost region in the horizontal direction, so that the sensitivity of the pixels in the outermost region in the horizontal direction is decreased more. Hence, the solid-state image pickup device according to the first embodiment in which the transparent interlayer insulating film not shown in the figures is formed over the branch part 21B of the first wiring 21 on the first transfer electrode 11 to take in light at a wide angle from the horizontal direction greatly contributes to an improvement in sensitivity of the pixels in the outermost region in the horizontal direction.

As described above, the height of the branch part 21B of the first wiring 21 from the gate oxide film 3 is somewhat greater than the height in the past. An opening portion of the light receiving unit 1 is generally long in the vertical direction. Thus, even when light is incident at a wide angle in the vertical direction, the sensitivity of the light receiving unit 1 to the light incident in the vertical direction is decreased slightly. Taking in incident light at a wide angle in the horizontal direction efficiently as in the solid-state image pickup device according to the first embodiment produces a greater improving effect in enhancing the sensitivity of the light receiving unit 1.

In addition, according to the first embodiment, the first transfer electrode 11 and the second transfer electrode 12 can be formed with a small film thickness. Thus, the aspect ratio of an interlayer insulating film formed between the first transfer electrode 11 and the second transfer electrode 12 is decreased as compared with the aspect ratio in the past, thus making it easy to fill the interlayer insulating film in between the first transfer electrode 11 and the second transfer electrode 12. Thus, an interval between the first transfer electrode 11 and the second transfer electrode 12 can be reduced, so that the first transfer electrode 11 and the second transfer electrode 12 can be increased in area. It is therefore possible to increase the capacitor capacitance of the first transfer electrode 11 and the second transfer electrode 12, and thereby transfer more electrons.

In addition, according to the first embodiment, because of the small film thickness of the first transfer electrode 11 and the second transfer electrode 12, the opposed areas of the first transfer electrode 11 and the second transfer electrode 12 are reduced. Hence, a capacitance between the first transfer electrode 11 and the second transfer electrode 12 can be reduced, thus decreasing an RC time constant and enabling high-speed driving.

Incidentally, in FIGS. 1A to 1D and FIGS. 2A to 2D, in order to facilitate description, an interlayer insulating film between the first wiring 21 and the second wiring 22 is not shown, and details of the semiconductor substrate 10 and details of a layer over the first wiring 21 are not shown either. It is needless to say that another interlayer insulating film, a light shielding film, a color filter, a microlens and the like are formed in the layer over the first wiring 21.

In addition, while the branch part 21B of the first wiring 21 is formed so as to extend in the vertical direction from the horizontal part 21A of the first wiring 21, the shape of the branch part 21B is not limited to this. For example, the branch part 21B may be formed so as to extend in the vertical direction in the shape of a V. In this case, the first wiring 21 formed of the branch part and the horizontal part in a plan view as viewed from above is in the shape of waves.

FIGS. 3A to 11D are diagrams illustrating a method of manufacturing the solid-state image pickup device according to the first embodiment, and illustrate a method of forming the first transfer electrode 11, the second transfer electrode 12, the first wiring 21, and the second wiring 22 on the gate oxide film 3.

In the following, a process of forming the light receiving units 1 and the transfer channel 2 in the semiconductor substrate 10 and a process of forming the gate oxide film 3 on the semiconductor substrate 10 will be omitted.

First, a film of polysilicon that is to become the first transfer electrode 11 and the second transfer electrode 12 is formed on the gate oxide film 3.

Next, as shown in FIGS. 3A, 3B, 3C, and 3D, the light receiving unit 1, the first transfer electrode 11, and the second transfer electrode 12 are patterned by a photoresist, the polysilicon is removed by a dry etching method, and thereafter the photoresist is removed. The first transfer electrode 11 and the second transfer electrode 12 are thereby formed.

Next, as shown in FIGS. 4A, 4B, 4C, and 4D, an interlayer insulating film 32 is formed on the first transfer electrode 11, the second transfer electrode 12, and the gate oxide film 3 to fill a gap between the first transfer electrode 11 and the second transfer electrode 12. The interlayer insulating film 32 is desirably $SiO_2$, for example, from a viewpoint of coupling capacitance. However, SiN or the like may be used as the interlayer insulating film 32.

Next, as shown in FIGS. 5A, 5B, 5C, and 5D, contact holes 32C for the contact parts 22C of the second wiring 22 are patterned by a photoresist on the interlayer insulating film 32, and the interlayer insulating film 32 is removed by a dry etching method with the photoresist as a mask. The contact holes 32C are thereby made.

Next, as shown in FIGS. 6A, 6B, 6C, and 6D, a film of polysilicon 42 that is to become the second wiring 22 is formed on the interlayer insulating film 32. Next, as shown in FIGS. 7A, 7B, 7C, and 7D, the second wiring 22 is patterned by a photoresist on the polysilicon 42, and the polysilicon 42 is removed by a dry etching method with the photoresist as a mask. The second wiring 22 is thereby made.

Next, as shown in FIGS. 8A, 8B, 8C, and 8D, an interlayer insulating film 31 is formed on the second wiring 22 and the interlayer insulating film 32. The interlayer insulating film 31 is desirably $SiO_2$, for example, from a viewpoint of coupling capacitance. However, SiN or the like may be used as the interlayer insulating film 31.

Next, as shown in FIGS. 9A, 9B, 9C, and 9D, contact holes 31C for the contact parts 21C of the first wiring 21 are patterned by a photoresist on the interlayer insulating film 31, and the interlayer insulating film 31 is removed by a dry etching method with the photoresist as a mask. The contact holes 31C are thereby made.

Next, as shown in FIGS. 10A, 10B, 10C, and 10D, a film of polysilicon 41 that is to become the first wiring 21 is formed on the interlayer insulating film 31. Next, as shown in FIGS. 11A, 11B, 11C, and 11D, the first wiring 21 is patterned by a photoresist on the polysilicon 41, and the polysilicon 41 is removed by a dry etching method with the photoresist as a mask. The first wiring 21 is thereby made.

In the solid-state image pickup device in the past shown in FIGS. 26A to 26C, FIG. 2C, and FIG. 2D, when polysilicon is removed by a dry etching method to form the first transfer electrode 111 and the second transfer electrode 112 on the gate oxide film 103, the gate oxide film 103 at parts of four corners of the light receiving unit 101, in particular, is damaged, and film thickness reduction occurs. A large film thickness reduction reaching the semiconductor substrate 100 results in a defect in the light receiving unit 101, from which defect electrons spring out. It is very difficult to control an amount of reduction in film thickness of the gate oxide film 103.

On the other hand, according to the first embodiment, because the film thickness of the first transfer electrode 11 and the second transfer electrode 12 can be reduced to about 40 nm, damage to the gate oxide film 3 at parts of four corners of the light receiving unit 1 is reduced, so that a defect in the light receiving unit 1 can be prevented effectively.

Second Embodiment

Figure 12A:
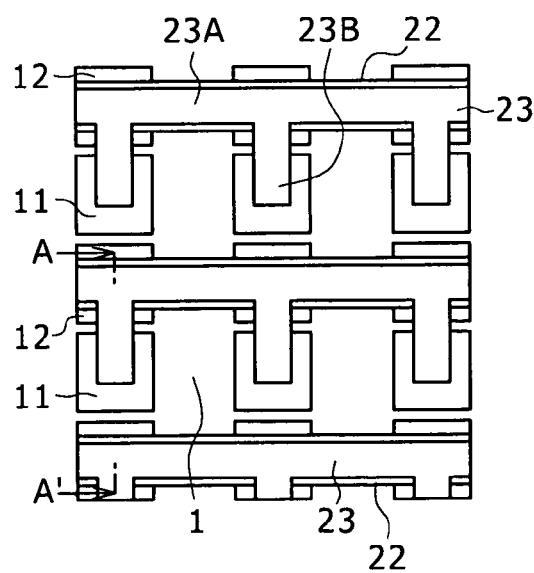
FIGS. 12A and 12B are diagrams showing a solid-state image pickup device according to a second embodiment, FIG. 12A a plan view, and FIG. 12B a sectional view taken along the line A-A' of FIG. 12A.
Figure 12B:
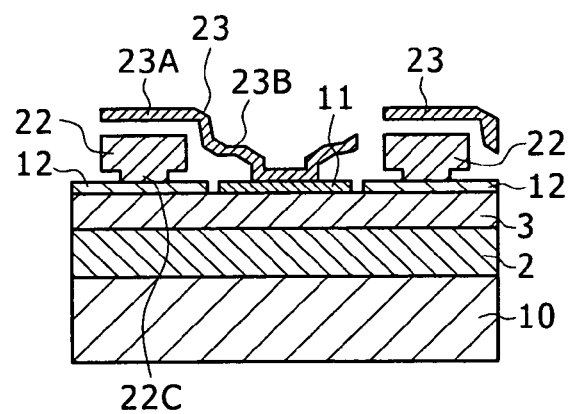

FIGS. 12A and 12B are diagrams showing a solid-state image pickup device according to a second embodiment. FIG. 12A is a plan view, and FIG. 12B is a sectional view taken along the line A-A' of FIG. 12A.

As shown in FIGS. 12A and 12B, the solid-state image pickup device according to the second embodiment is formed by replacing the first wiring 21 in the solid-state image pickup device according to the first embodiment which device is shown in FIGS. 1A to 1D and FIGS. 2A and 2B with first wiring 23 made of a metal. Other parts form a similar constitution to that of the solid-state image pickup device according to the first embodiment, and are identified by the same reference numerals. Description of the other parts will be omitted.

The metal of the first wiring 23 is desirably W, Al, or Ti, for example. However, the metal of the first wiring 23 may be Cu, Ta, Pt, Ir, or Ru. In addition, the metal of the first wiring 23 may be an alloy of at least two of Al, Ti, Cu, Ta, Pt, Ir, and Ru. Further, the metal of the first wiring 23 may be a silicide, a nitride, or a laminate thereof.

According to the second embodiment, the specific resistance of the first wiring 23 can be lowered as compared with polysilicon. Thus, when the specific resistance of the first wiring 23 is set to be about the same as that of polysilicon, the film thickness of the first wiring 23 can be reduced, and thereby the height of the first wiring 23 from a gate oxide film 3 can be greatly lowered. It is thus possible to reduce shading of incident light from a wide angle, and thereby further improve the sensitivity of light receiving units 1.

In addition, because the specific resistance of the first wiring 23 can be lowered as compared with polysilicon, the readout voltage of the light receiving units 1 can be decreased. In addition, a time before a voltage is applied to a pixel in a central part whose wiring length is longer than that of a pixel in a peripheral part can be shortened as compared with polysilicon wiring. It is therefore possible to suppress an increase in applied voltage due to a propagation delay, and suppress an increase in applied voltage due to a voltage drop at a pixel in the central part of the CCD.

In addition, when the first wiring 23 is increased in wiring width so as to cover a first transfer electrode 11 and a second transfer electrode 12, the first wiring 23 can also serve as a light shielding film forming the opening of the light receiving unit 1. Thereby, a light shielding film in a layer above a wiring layer in the past can be omitted.

Third Embodiment

Figure 13A:
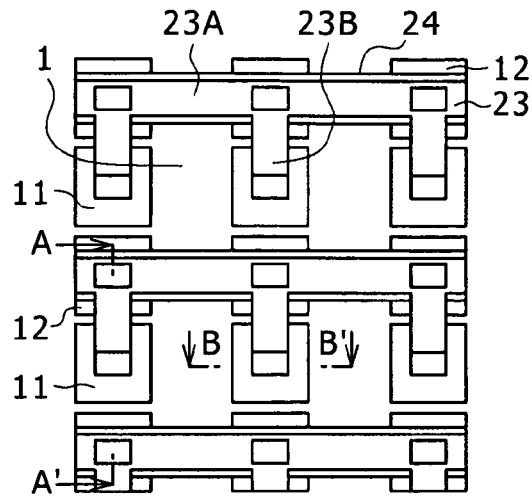
FIGS. 13A, 13B, 13C, 13D, and 13E are diagrams showing a solid-state image pickup device according to a third embodiment, FIG. 13A a plan view, FIG. 13B a sectional view taken along the line A-A' of FIG. 13A, FIG. 13C a sectional view taken along the line B-B' of FIG. 13A, FIG. 13D a diagram of assistance in explaining a part of second wiring in FIG. 13A, and FIG. 13E a diagram of assistance in explaining a part of first wiring in FIG. 13A.
Figure 13B:
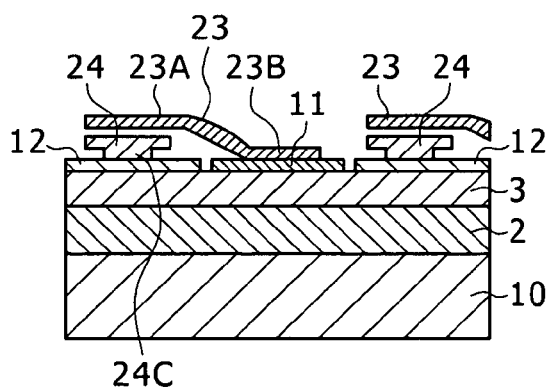
Figure 13D:
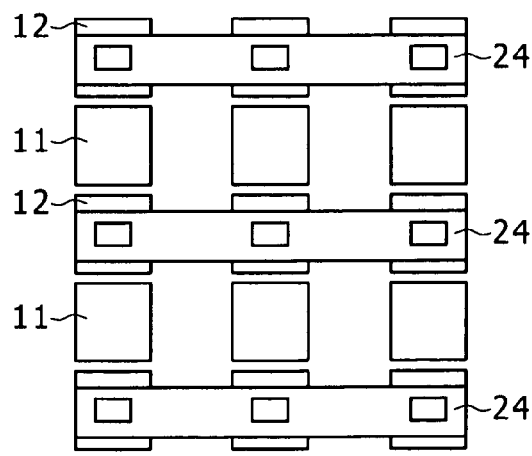
Figure 13C:
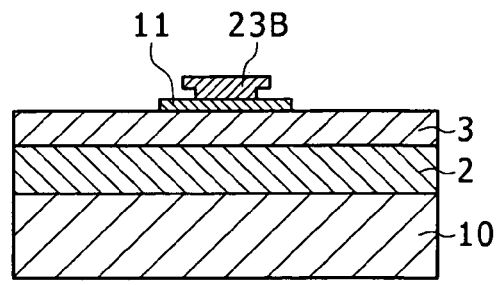
Figure 13E:
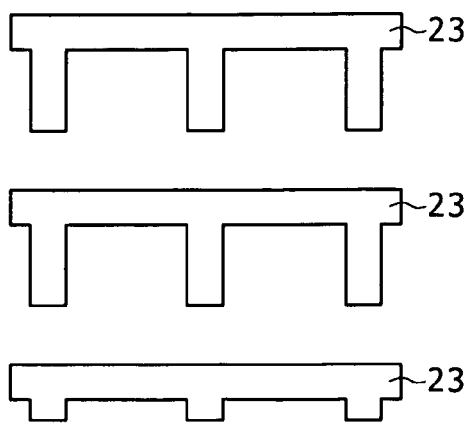

FIGS. 13A, 13B, 13C, 13D, and 13E are diagrams showing a solid-state image pickup device according to a third embodiment. FIG. 13A is a plan view, FIG. 13B is a sectional view taken along the line A-A' of FIG. 13A, FIG. 13C is a sectional view taken along the line B-B' of FIG. 13A, FIG. 13D is a diagram of assistance in explaining a part of second wiring in FIG. 13A, and FIG. 13E is a diagram of assistance in explaining a part of first wiring in FIG. 13A.

As shown in FIGS. 13A to 13E, the solid-state image pickup device according to the third embodiment is formed by replacing the second wiring 22 in the solid-state image pickup device according to the second embodiment which device is shown in FIGS. 12A and 12B with second wiring 24 made of a metal, and both first wiring 23 and the second wiring 24 are metallic wiring. Other parts form a similar constitution to that of the solid-state image pickup device according to the first embodiment, and are identified by the same reference numerals. Description of the other parts will be omitted.

The metal of the second wiring 24 is desirably W, Al, or Ti, for example. However, the metal of the second wiring 24 may be Cu, Ta, Pt, Ir, or Ru. In addition, the metal of the second wiring 24 may be an alloy of at least two of Al, Ti, Cu, Ta, Pt, Ir, and Ru. Further, the metal of the second wiring 24 may be a silicide, a nitride, or a laminate thereof.

According to the third embodiment, the specific resistance of the first wiring 23 and the second wiring 24 can be lowered as compared with polysilicon. Thus, when the specific resistance of the first wiring 23 and the second wiring 24 is set to be about the same as that of polysilicon, the film thickness of the first wiring 23 and the second wiring 24 can be reduced, and thereby the height of the first wiring 23 from a gate oxide film 3 can be further lowered. It is thus possible to further reduce shading of incident light from a wide angle, and thereby further improve the sensitivity of light receiving units 1.

In addition, when the first wiring 23 and the second wiring 24 are increased in wiring width so as to cover a first transfer electrode 11 and a second transfer electrode 12, the first wiring 23 and the second wiring 24 can also serve as a light shielding film forming an opening of the light receiving unit 1. Thereby, a light shielding film in a layer above a wiring layer in the past can be omitted. In the following, description will be made of examples of modification of the first wiring 23 and the second wiring 24 serving also as a light shielding film.

Figure 14A:
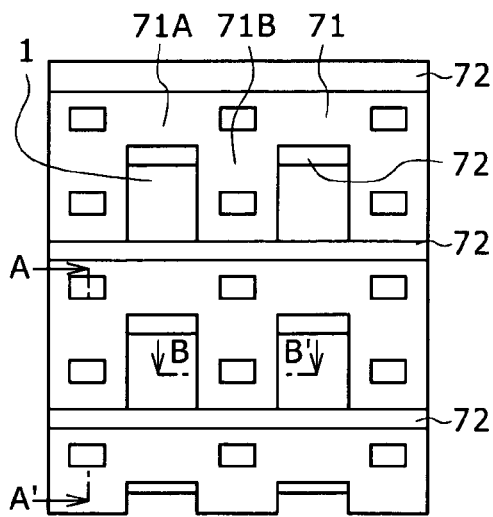
FIGS. 14A, 14B, 14C, 14D, and 14E are diagrams showing a solid-state image pickup device according to a first example of modification of the third embodiment, FIG. 14A a plan view, FIG. 14B a sectional view taken along the line A-A' of FIG. 14A, FIG. 14C a sectional view taken along the line B-B' of FIG. 14A, FIG. 14D a diagram of assistance in explaining a part of second wiring in FIG. 14A, and FIG. 14E a diagram of assistance in explaining a part of first wiring in FIG. 14A.
Figure 14B:
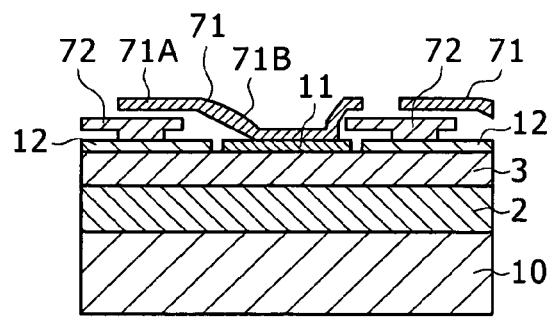
Figure 14D:
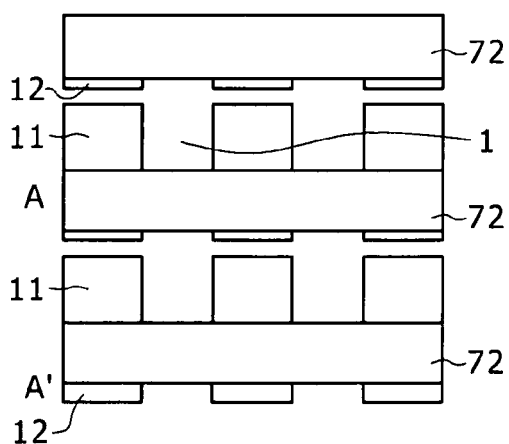
Figure 14C:
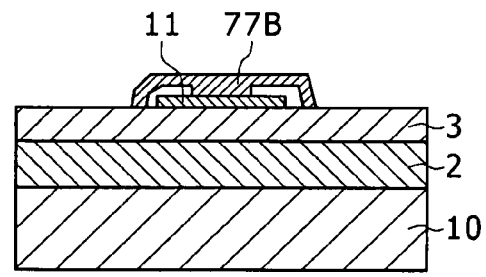
Figure 14E:
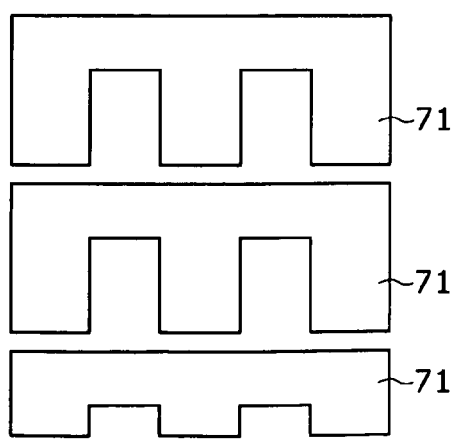

FIGS. 14A, 14B, 14C, 14D, and 14E are diagrams showing a solid-state image pickup device according to a first example of modification of the third embodiment. FIG. 14A is a plan view, FIG. 14B is a sectional view taken along the line A-A' of FIG. 14A, FIG. 14C is a sectional view taken along the line B-B' of FIG. 14A, FIG. 14D is a diagram of assistance in explaining a part of second wiring in FIG. 14A, and FIG. 14E is a diagram of assistance in explaining a part of first wiring in FIG. 14A.

As shown in FIGS. 14A to 14E, this solid-state image pickup device is formed by replacing the first wiring 23 and the second wiring 24 shown in FIGS. 13A to 13E with first wiring 71 and second wiring 72, respectively. The wiring width of the first wiring 71 and the second wiring 72 is wide so as to cover a first transfer electrode 11 and a second transfer electrode 12. In addition, the branch part 71B of the first wiring 71 is further extended from the first transfer electrode 11 so as to overlap second wiring in a next row. The branch part 71B of the first wiring 71 covers both sides of the first transfer electrode 11.

FIGS. 15A, 15B, 15C, 15D, and 15E are diagrams showing a solid-state image pickup device according to a second example of modification of the third embodiment. FIG. 15A is a plan view, FIG. 15B is a sectional view taken along the line A-A' of FIG. 15A, FIG. 15C is a sectional view taken along the line B-B' of FIG. 15A, FIG. 15D is a diagram of assistance in explaining a part of first wiring in FIG. 15A, and FIG. 15E is a diagram of assistance in explaining a part of second wiring in FIG. 15A.

As shown in FIGS. 15A to 15E, the first wiring 71 and the second wiring 72 shown in FIGS. 14A to 14E are replaced with first wiring 73 and second wiring 74, respectively, and the order of formation of the wiring is reversed. In FIGS. 14A to 14E, the first wiring 71 is formed after the formation of the second wiring 72, whereas in FIGS. 15A to 15E, the second wiring 74 is formed after the formation of the first wiring 73.

FIGS. 16A, 16B, 16C, 16D, and 16E are diagrams showing a solid-state image pickup device according to a third example of modification of the third embodiment. FIG. 16A is a plan view, FIG. 16B is a sectional view taken along the line A-A' of FIG. 16A, FIG. 16C is a sectional view taken along the line B-B' of FIG. 16A, FIG. 16D is a diagram of assistance in explaining a part of first wiring in FIG. 16A, and FIG. 16E is a diagram of assistance in explaining a part of second wiring in FIG. 16A.

As shown in FIGS. 16A to 16E, this solid-state image pickup device is formed by replacing the first wiring 73 and the second wiring 74 shown in FIGS. 15A to 15E with first wiring 75 and second wiring 76, respectively.

The first wiring 75 is formed in the shape of a lattice so as to surround light receiving units 1. Specifically, the first wiring 75 includes a horizontal part 75A adjacent to the second wiring 76 in the same row, a horizontal part 75C adjacent to a next row, and a branch part 75B that joins these horizontal parts to each other and is connected to a first transfer electrode.

Figure 17A:
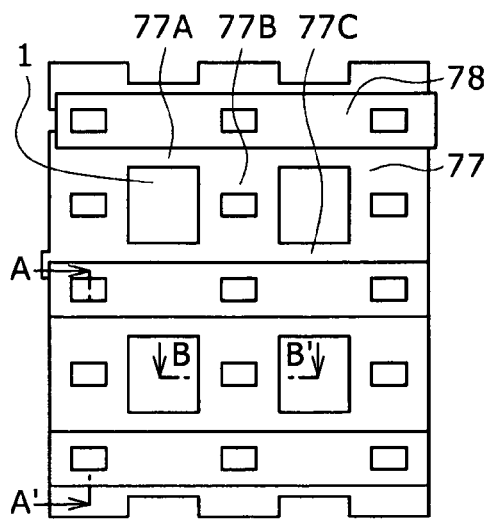
FIGS. 17A, 17B, 17C, 17D, and 17E are diagrams showing a solid-state image pickup device according to a fourth example of modification of the third embodiment, FIG. 17A a plan view, FIG. 17B a sectional view taken along the line A-A' of FIG. 17A, FIG. 17C a sectional view taken along the line B-B' of FIG. 17A, FIG. 17D a diagram of assistance in explaining a part of second wiring in FIG. 17A, and FIG. 17E a diagram of assistance in explaining a part of first wiring in FIG. 17A.
Figure 17B:
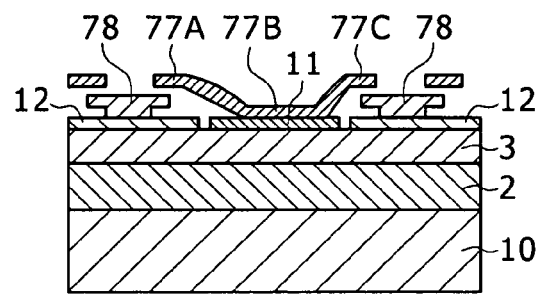
Figure 17D:
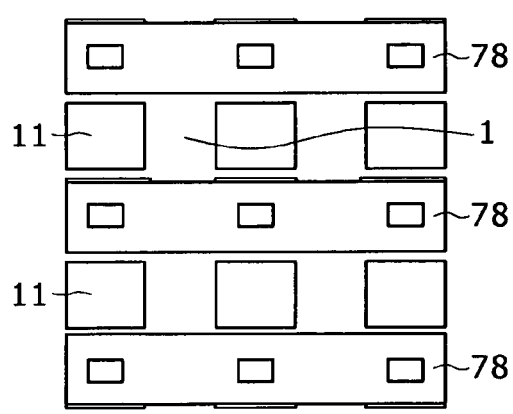
Figure 17C:
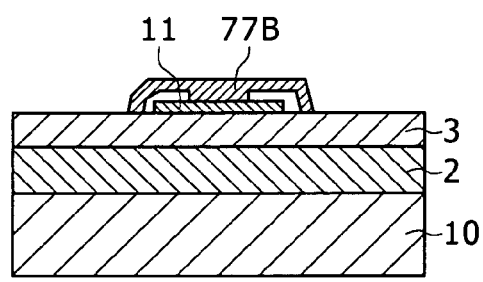
Figure 17E:
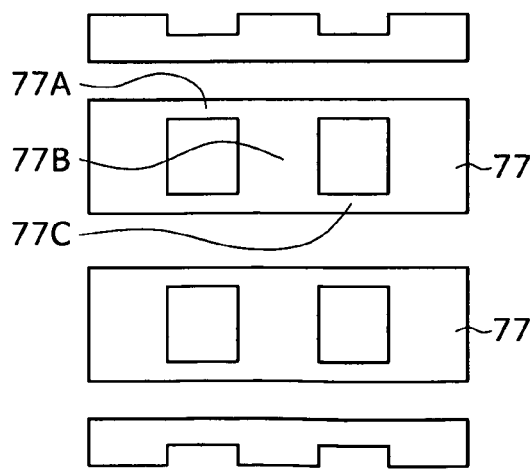

FIGS. 17A, 17B, 17C, 17D, and 17E are diagrams showing a solid-state image pickup device according to a fourth example of modification of the third embodiment. FIG. 17A is a plan view, FIG. 17B is a sectional view taken along the line A-A' of FIG. 17A, FIG. 17C is a sectional view taken along the line B-B' of FIG. 17A, FIG. 17D is a diagram of assistance in explaining a part of second wiring in FIG. 17A, and FIG. 17E is a diagram of assistance in explaining a part of first wiring in FIG. 17A.

As shown in FIGS. 17A to 17E, this solid-state image pickup device is formed by replacing the first wiring 75 and the second wiring 76 shown in FIGS. 16A to 16E with first wiring 77 and second wiring 78, respectively, the order of formation of the wiring being reversed.

As with the first wiring 75, the first wiring 77 is formed in the shape of a lattice.

In FIGS. 16A to 16E, the second wiring 76 is formed after the formation of the first wiring 75, whereas in FIGS. 17A to 17E, the first wiring 77 is formed after the formation of the second wiring 78.

Figure 18A:
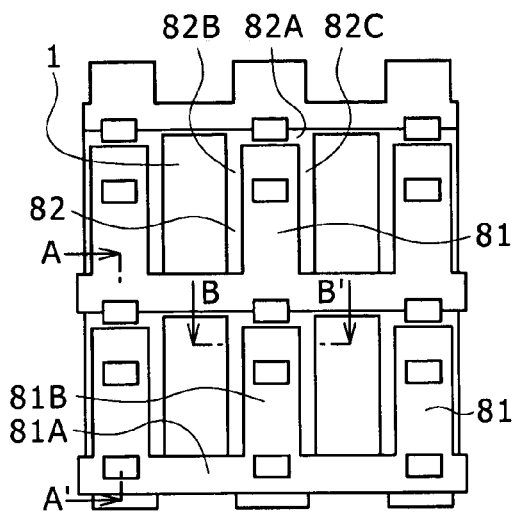
FIGS. 18A, 18B, 18C, 18D, and 18E are diagrams showing a solid-state image pickup device according to a fifth example of modification of the third embodiment, FIG. 18A a plan view, FIG. 18B a sectional view taken along the line A-A' of FIG. 18A, FIG. 18C a sectional view taken along the line B-B' of FIG. 18A, FIG. 18D a diagram of assistance in explaining a part of second wiring in FIG. 18A, and FIG. 18E a diagram of assistance in explaining a part of first wiring in FIG. 18A.
Figure 18B:
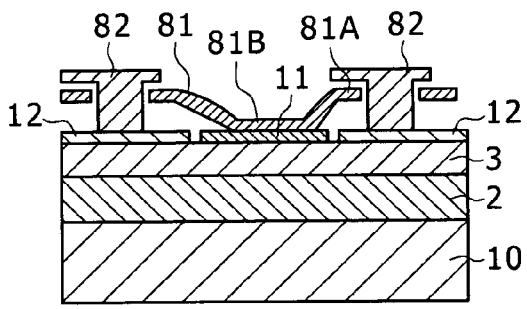
Figure 18D:
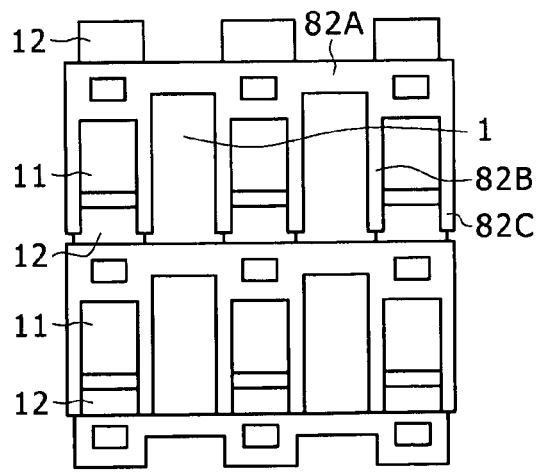
Figure 18C:
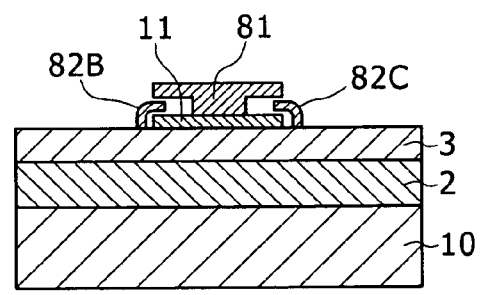
Figure 18E:
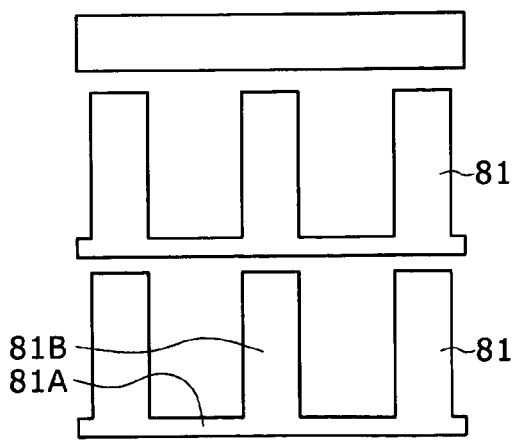

FIGS. 18A, 18B, 18C, 18D, and 18E are diagrams showing a solid-state image pickup device according to a fifth example of modification of the third embodiment. FIG. 18A is a plan view, FIG. 18B is a sectional view taken along the line A-A' of FIG. 18A, FIG. 18C is a sectional view taken along the line B-B' of FIG. 18A, FIG. 18D is a diagram of assistance in explaining a part of second wiring in FIG. 18A, and FIG. 18E is a diagram of assistance in explaining a part of first wiring in FIG. 18A.

As shown in FIGS. 18A to 18E, this solid-state image pickup device includes first wiring 81 connected to a first transfer electrode 11 and second wiring 82 connected to a second transfer electrode. The second wiring 82 has a horizontal part 82A disposed on the second electrode in a horizontal direction. The first wiring 81 has a horizontal part 81A disposed in the horizontal direction so as to be adjacent to the horizontal part 82A of second wiring 82 in a next row and a branch part 81B extending in the form of a branch in a vertical direction from the horizontal part 81A and reaching the first transfer electrode 11. The branch part 81B of the horizontal part 81 is spread with substantially the same width as that of the first transfer electrode 11, passes the first transfer electrode 11 from the horizontal part 81A, and extends so as to approach the horizontal part 82A of the second wiring 82. The second wiring 82 has two branch parts 82B and 82C extending from the horizontal part 82A of the second wiring 82 along both sides in the vertical direction of the first transfer electrode 11 and the second transfer electrode 12 under the branch part 81B of the first wiring 81.

With such a constitution, unlike the case of light shielding being performed by the first wiring 71, 73, 75, or 77 connected to the first transfer electrode 11, readout voltage is not applied at the light receiving unit 1 in the vicinity of the first transfer electrode 11. In the case of FIGS. 16A to 16E, for example, when electrons are read out from the light receiving unit 1, a voltage of about +10 (V) needs to be applied in order to break a potential barrier between the light receiving unit 1 and a transfer part. However, because the voltage is also applied to wiring material, there is a fear of a leakage current flowing between the wiring material and a silicon substrate. On the other hand, in the case of the wiring of FIGS. 18A to 18E, there is no such fear because the readout voltage is not applied to the electrode on the side of the light receiving unit 1.

Incidentally, the first wiring 23 is formed by a metal in the second embodiment, and the first wiring 23 and the second wiring 24 are formed by a metal in the third embodiment. However, the first wiring 21 in the first embodiment may be formed by polysilicon, and only the second wiring 22 may be formed by a metal. Also in this case, the height of the first wiring 23 from the gate oxide film 3 can be greatly lowered. It is thus possible to reduce shading of incident light from a wide angle, and thereby further improve the sensitivity of the light receiving units 1.

Fourth Embodiment

Figure 19A:
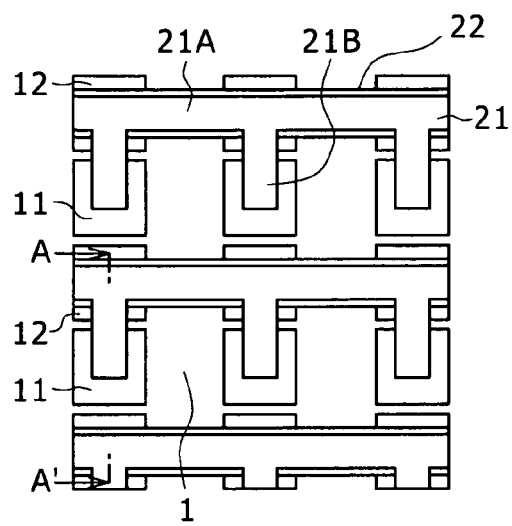
FIGS. 19A, 19B, 19C, and 19D are diagrams showing a solid-state image pickup device according to a fourth embodiment, FIG. 19A a plan view, FIG. 19B a sectional view taken along the line A-A' of FIG. 19A, FIG. 19C a diagram of assistance in explaining a part of transfer electrodes in FIG. 19A, and FIG. 19D a diagram of assistance in explaining a part of second wiring in FIG. 19A.
Figure 19B:
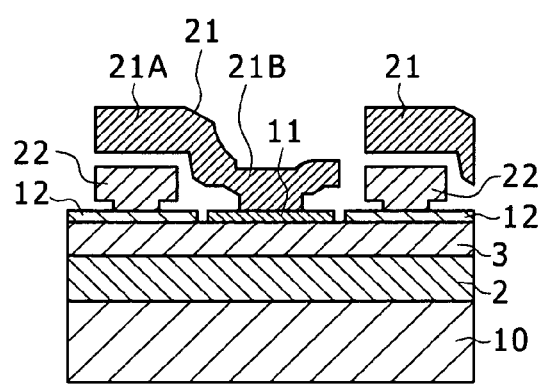
Figure 19C:
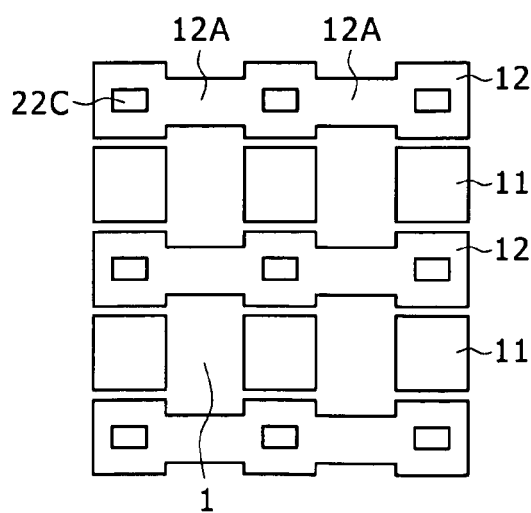
Figure 19D:
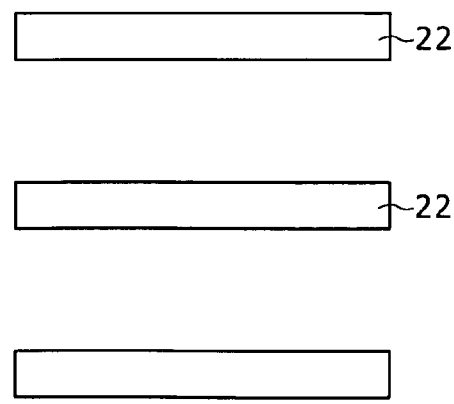

FIGS. 19A, 19B, 19C, and 19D are diagrams showing a solid-state image pickup device according to a fourth embodiment. FIG. 19A is a plan view, FIG. 19B is a sectional view taken along the line A-A' of FIG. 19A, FIG. 19C is a diagram of assistance in explaining a part of transfer electrodes in FIG. 19A, and FIG. 19D is a diagram of assistance in explaining a part of second wiring in FIG. 19A.

As shown in FIGS. 19A to 19D, the solid-state image pickup device according to the fourth embodiment is formed by coupling the second transfer electrodes 12 in the solid-state image pickup device according to the first embodiment which device is shown in FIGS. 1A to 1D to each other in the horizontal direction by a coupling part 12A. The coupling part 12A is manufactured by one-time formation of film of polysilicon together with a first transfer electrode 11 and a second transfer electrode.

According to the fourth embodiment, because the second transfer electrodes 12 are coupled to each other in the horizontal direction by the coupling part 12A, the second transfer electrodes 12 can be further reduced in thickness. It is thus possible to reduce shading of incident light from a wide angle, and thereby further improve the sensitivity of light receiving units 1.

In addition, even when one contact has a defective opening, voltage can be applied from a next contact through the polysilicon.

Fifth Embodiment

Figure 20A:
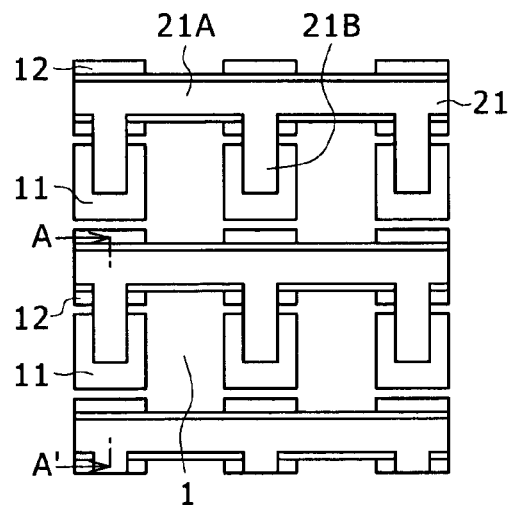
FIGS. 20A, 20B, 20C, and 20D are diagrams showing a solid-state image pickup device according to a fifth embodiment, FIG. 20A a plan view, FIG. 20B a sectional view taken along the line A-A' of FIG. 20A, FIG. 20C a diagram of assistance in explaining a part of transfer electrodes in FIG. 20A, and FIG. 20D a diagram of assistance in explaining a part of second wiring in FIG. 20A.
Figure 20B:
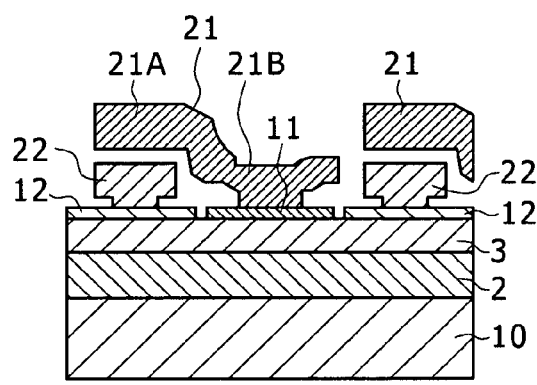
Figure 20C:
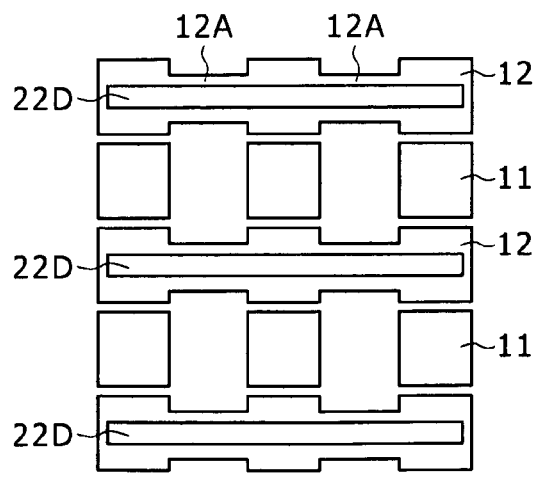
Figure 20D:
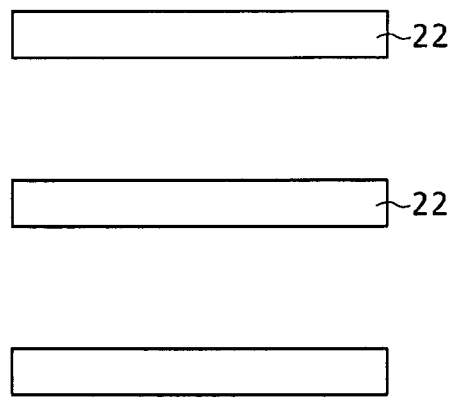

FIGS. 20A, 20B, 20C, and 20D are diagrams showing a solid-state image pickup device according to a fifth embodiment. FIG. 20A is a plan view, FIG. 20B is a sectional view taken along the line A-A' of FIG. 20A, FIG. 20C is a diagram of assistance in explaining a part of transfer electrodes in FIG. 20A, and FIG. 20D is a diagram of assistance in explaining a part of second wiring in FIG. 20A.

As shown in FIGS. 20A to 20D, the solid-state image pickup device according to the fifth embodiment has second transfer electrodes 12 coupled to each other in a horizontal direction by a coupling part 12A as in the solid-state image pickup device according to the fourth embodiment. However, rather than second wiring 22 being connected to the second transfer electrodes 12 by contact parts 22C, the second wiring 22 is connected to the second transfer electrodes 12 by a contact part 22D that is long and continuous in the horizontal direction. When the contact part 22D is thus formed, contact formation becomes easier, and the second transfer electrodes 12 can be further reduced in thickness. It is thus possible to reduce shading of incident light from a wide angle, and thereby further improve the sensitivity of light receiving units 1.

Sixth Embodiment

Figure 21A:
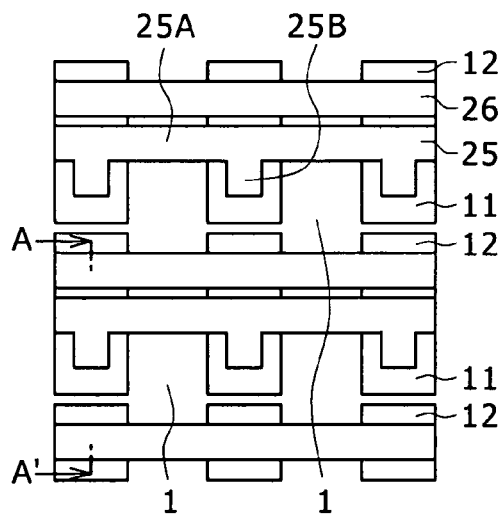
FIGS. 21A, 21B, 21C, and 21D are diagrams showing a solid-state image pickup device according to a sixth embodiment, FIG. 21A a plan view, FIG. 21B a sectional view taken along the line A-A' of FIG. 21A, FIG. 21C a diagram of assistance in explaining a part of transfer electrodes in FIG. 21A, and FIG. 21D a diagram of assistance in explaining a part of first wiring and second wiring in FIG. 21A.
Figure 21B:
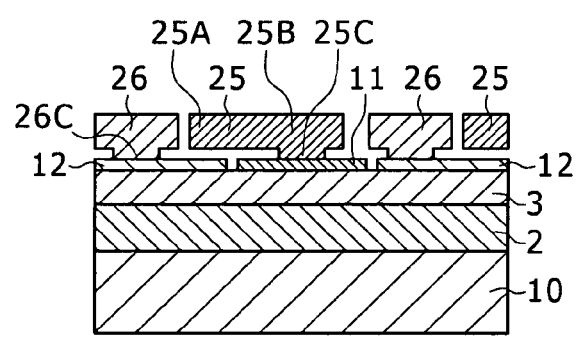
Figure 21C:
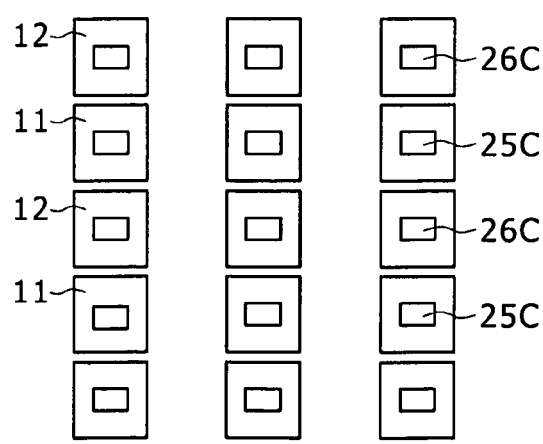
Figure 21D:
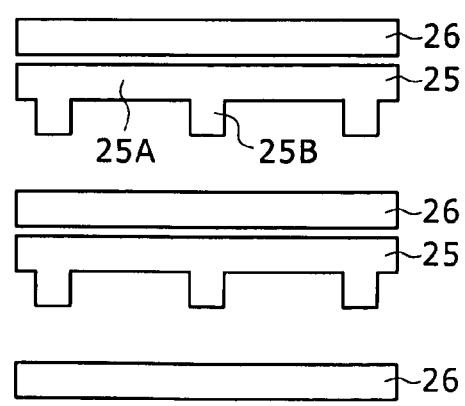

FIGS. 21A, 21B, 21C, and 21D are diagrams showing a solid-state image pickup device according to a sixth embodiment. FIG. 21A is a plan view, FIG. 21B is a sectional view taken along the line A-A' of FIG. 21A, FIG. 21C is a diagram of assistance in explaining a part of transfer electrodes in FIG. 21A, and FIG. 21D is a diagram of assistance in explaining a part of first wiring and second wiring in FIG. 21A.

Figure 22A:
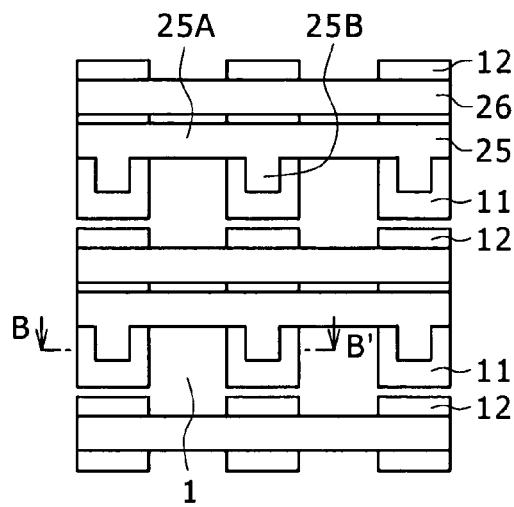
FIG. 22A is a plan view of the solid-state image pickup device according to the sixth embodiment.
Figure 22C:
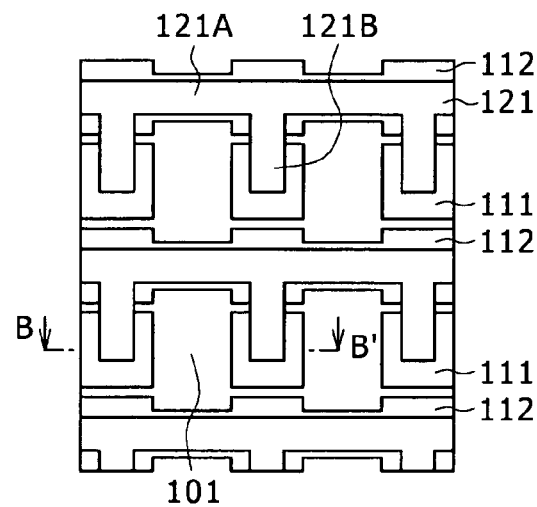
FIG. 22C is a plan view of the solid-state image pickup device in the past shown in FIGS. 26A, 26B, and 26C.
Figure 22B:
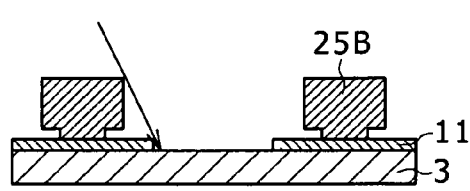
FIG. 22B is a sectional view taken along the line B-B' of FIG. 22A.
Figure 22D:
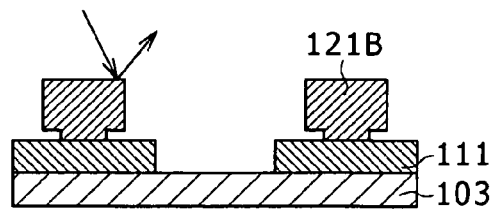
FIG. 22D is a sectional view taken along the line B-B' of FIG. 22C.

FIG. 22A is a plan view of the solid-state image pickup device according to the sixth embodiment which device is shown in FIGS. 21A to 21D. FIG. 22B is a sectional view taken along the line B-B' of FIG. 22A. FIG. 22C is a plan view of the solid-state image pickup device in the past shown in FIGS. 26A to 26C. FIG. 22D is a sectional view taken along the line B-B' of FIG. 22C.

As shown in FIGS. 21A to 21D and FIG. 22A, the solid-state image pickup device according to the sixth embodiment differs from the solid-state image pickup device according to the first embodiment in that first wiring 25 for coupling first transfer electrodes 11 to each other in a horizontal direction and second wiring 26 for coupling second transfer electrodes 12 to each other in the horizontal direction are formed by a polysilicon formed film in one layer and are disposed in parallel with each other. Other parts form a similar constitution to that of the solid-state image pickup device according to the first embodiment, and are identified by the same reference numerals. Description of the other parts will be omitted.

The second wiring 26 is disposed on the second transfer electrodes 12. The second wiring 26 is connected to the second transfer electrodes 12 by contact parts 26C under the second wiring 26. The first wiring 25 is disposed so as to be adjacent and parallel to the second wiring. The first wiring 25 includes a horizontal part 25A extending in the horizontal direction above the second transfer electrodes 12 and a branch part 25B extending from the horizontal part 25A and extending in a vertical direction above a transfer channel 2. The branch part 25B is connected to the first transfer electrode 11 via a contact part 25C under the branch part 25B.

According to the sixth embodiment, the first wiring 25 and the second wiring 26 are formed by a polysilicon formed film in one layer and are disposed in parallel with each other. Thus, while the size in the vertical direction of light receiving units 1 is reduced, the height of the first wiring 25 and the second wiring 26 from a gate oxide film 3 can be lowered. It is thus possible to reduce shading of incident light from a wide angle, and thereby further improve the sensitivity of the light receiving units 1. In addition, because the first wiring 25 and the second wiring 26 can be formed by a polysilicon formed film in one layer, the number of processes can be reduced.

Seventh Embodiment

Figure 23A:
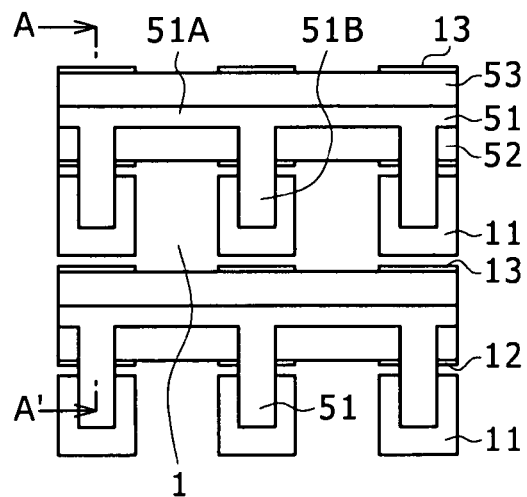
FIGS. 23A, 23B, 23C, and 23D are diagrams showing a solid-state image pickup device according to a seventh embodiment, FIG. 23A a plan view, FIG. 23B a sectional view taken along the line A-A' of FIG. 23A, FIG. 23C a diagram of assistance in explaining a part of transfer electrodes in FIG. 23A, and FIG. 23D a diagram of assistance in explaining a part of second wiring and third wiring in FIG. 23A.
Figure 23B:
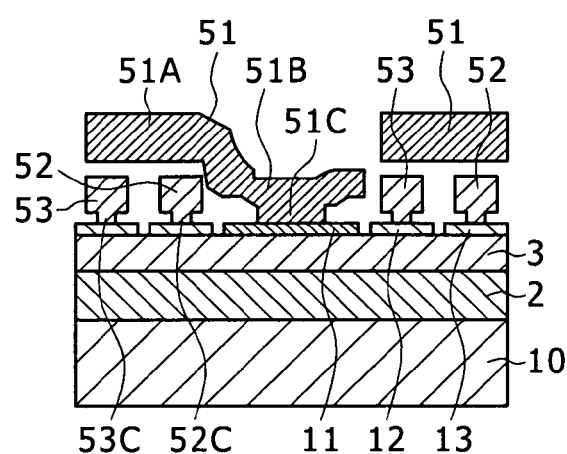
Figure 23C:
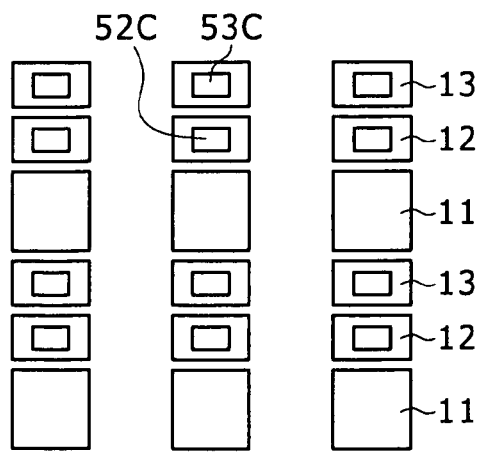
Figure 23D:
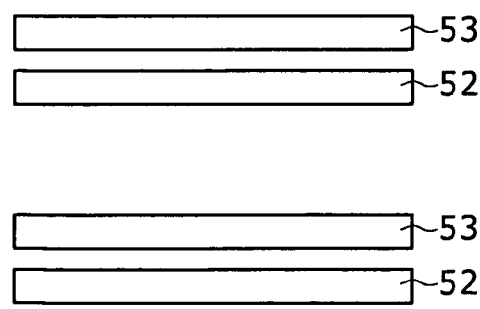

FIGS. 23A, 23B, 23C, and 23D are diagrams showing a solid-state image pickup device according to a seventh embodiment. FIG. 23A is a plan view, FIG. 23B is a sectional view taken along the line A-A' of FIG. 23A, FIG. 23C is a diagram of assistance in explaining a part of transfer electrodes in FIG. 23A, and FIG. 23D is a diagram of assistance in explaining a part of second wiring and third wiring in FIG. 23A.

The solid-state image pickup device according to the seventh embodiment is an example of a three-phase driving CCD or a six-phase driving CCD. Incidentally, similar constituent parts to those of the first embodiment are identified by the same reference numerals, and description thereof will be omitted.

The solid-state image pickup device according to the seventh embodiment has a third transfer electrode 13 in addition to the first transfer electrode 11 and the second transfer electrode 12 of the first embodiment. The first transfer electrode 11 is to read a signal charge accumulated in a light receiving unit 1 and transfer the signal charge to the second transfer electrode 12 in the vertical direction. The second transfer electrode 12 is to transfer the signal charge transferred by the first transfer electrode 11 to the third transfer electrode 13 in the vertical direction. The third transfer electrode 13 is to transfer the signal charge transferred by the second transfer electrode 12 to a first transfer electrode 11 in a next row in the vertical direction. The first transfer electrode 11, the second transfer electrode 12, and the third transfer electrode 13 have a so-called single-layer type electrode structure, and are formed by one-time formation of film of polysilicon.

First transfer electrodes 11 are coupled to each other in each row in a horizontal direction by first wiring 51. Second transfer electrodes 12 are coupled to each other in each row in the horizontal direction by second wiring 52. Third transfer electrodes 13 are coupled to each other in each row in the horizontal direction by third wiring 53.

The second wiring 52 is disposed on the second transfer electrodes 12, extends in the horizontal direction, and is connected to the second transfer electrodes 12 via contact parts 52C under the second wiring 52. The third wiring 53 is disposed on the third transfer electrodes 13, extends in the horizontal direction, and is connected to the third transfer electrodes 13 via contact parts 53C under the third wiring 53.

The first wiring 51 includes a horizontal part 51A extending in the horizontal direction in a layer above the second wiring 52 and the third wiring 53 and a branch part 51B extending from the horizontal part 51A and extending in the vertical direction above a transfer channel 2. The branch part 51B is bent from the horizontal part 51A toward the first transfer electrode 11 and extends on the first transfer electrode 11 such that a space of a transparent interlayer insulating film not shown in the figures is formed over the branch part 51B extending on the first transfer electrode 11. The branch part 51B is connected to the first transfer electrode 11 via a contact part 51C under the branch part 51B.

The second wiring 52 and the third wiring 53 are formed by a polysilicon formed film in a same layer. The first wiring 51 is formed in the layer above the second wiring 52 and the third wiring 53 with an interlayer insulating film interposed between the first wiring 51 and the second wiring 52 and the third wiring 53.

According to the seventh embodiment, as in the first embodiment, a space of a transparent interlayer insulating film is formed over the branch part 51B of the first wiring 51 on the first transfer electrode to reduce shading of incident light from a wide angle in the horizontal direction. Thus, the sensitivity of light receiving units 1 can be improved.

Eighth Embodiment

Figure 24A:
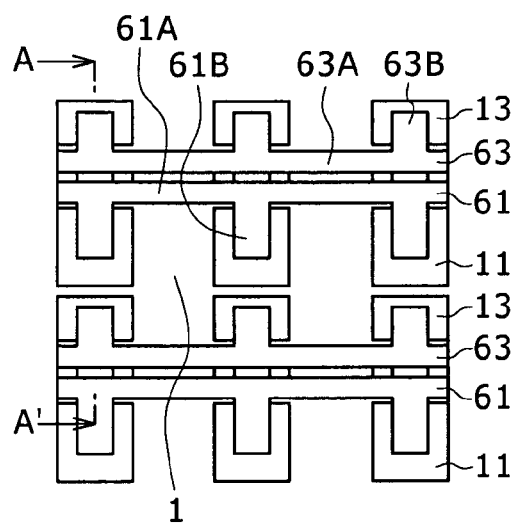
FIGS. 24A, 24B, 24C, and 24D are diagrams showing a solid-state image pickup device according to an eighth embodiment, FIG. 24A a plan view, FIG. 24B a sectional view taken along the line A-A' of FIG. 24A, FIG. 24C a diagram of assistance in explaining a part of transfer electrodes in FIG. 24A, and FIG. 24D a diagram of assistance in explaining a part of first wiring and second wiring in FIG. 24A.
Figure 24B:
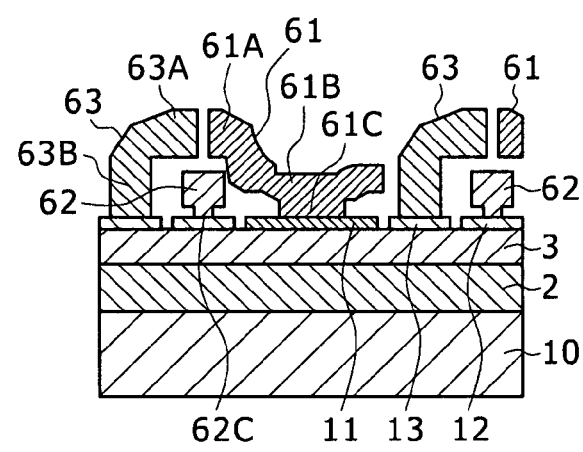
Figure 24C:
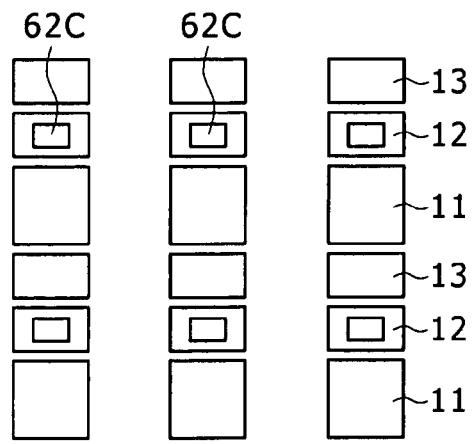
Figure 24D:
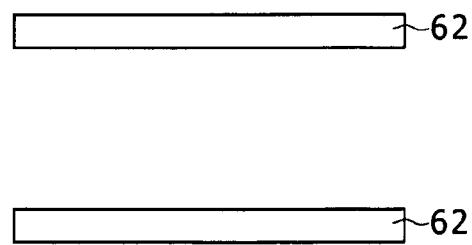

FIGS. 24A, 24B, 24C, and 24D are diagrams showing a solid-state image pickup device according to an eighth embodiment. FIG. 24A is a plan view, FIG. 24B is a sectional view taken along the line A-A' of FIG. 24A, FIG. 24C is a diagram of assistance in explaining a part of transfer electrodes in FIG. 24A, and FIG. 24D is a diagram of assistance in explaining a part of first wiring and second wiring in FIG. 24A.

The solid-state image pickup device according to the eighth embodiment is formed by replacing the first wiring 51, the second wiring 52, and the third wiring 53 in the solid-state image pickup device according to the seventh embodiment with first wiring 61, second wiring 62, and third wiring 63. Other parts form a similar constitution to that of the solid-state image pickup device according to the seventh embodiment, and are identified by the same reference numerals. Description of the other parts will be omitted.

First wiring 61 couples first transfer electrodes 11 in a same row to each other in a horizontal direction. Second wiring 62 couples second transfer electrodes 12 in a same row to each other in the horizontal direction. Third wiring 63 couples third transfer electrodes 13 in a same row to each other in the horizontal direction.

The second wiring 62 is disposed on the second transfer electrodes 12, extends in the horizontal direction, and is connected to the second transfer electrodes 12 via contact parts 62C under the second wiring 62.

The first wiring 61 includes a horizontal part 61A extending in the horizontal direction in a layer above the second wiring 62 and a branch part 61B extending from the horizontal part 61A and extending in the vertical direction above a transfer channel 2. The branch part 61B is bent from the horizontal part 61A toward the first transfer electrode 11 and extends on the first transfer electrode 11 such that a space of a transparent interlayer insulating film not shown in the figures is formed over the branch part 61B extending on the first transfer electrode 11. The branch part 61B is connected to the first transfer electrode 11 via a contact part 61C under the branch part 61B.

The third wiring 63 includes a horizontal part 63A extending in the horizontal direction in the layer above the second wiring 62 and a branch part 63B extending from the horizontal part 63A and extending in the vertical direction above the transfer channel 2. The branch part 63B is bent from the horizontal part 63A toward the first transfer electrode 11 and extends on the third transfer electrode 13. The branch part 63B is connected to the third transfer electrode 13 via a contact part 63C under the branch part 63B.

The first wiring 61 and the third wiring 63 are formed in the layer above the second wiring 62 with an interlayer insulating film interposed between the first wiring 61 and the third wiring 63 and the second wiring 62. The first wiring 61 and the third wiring 63 are formed by a polysilicon formed film in the same layer.

According to the eighth embodiment, as in the seventh embodiment, a space of a transparent interlayer insulating film is formed over the branch part 61B of the first wiring 61 on the first transfer electrode to reduce shading of incident light from a wide angle in the horizontal direction. Thus, the sensitivity of light receiving units 1 can be improved.

Ninth Embodiment

A concrete example of an image pickup device to which the present invention is applied will be described as a ninth embodiment.

Figure 25:
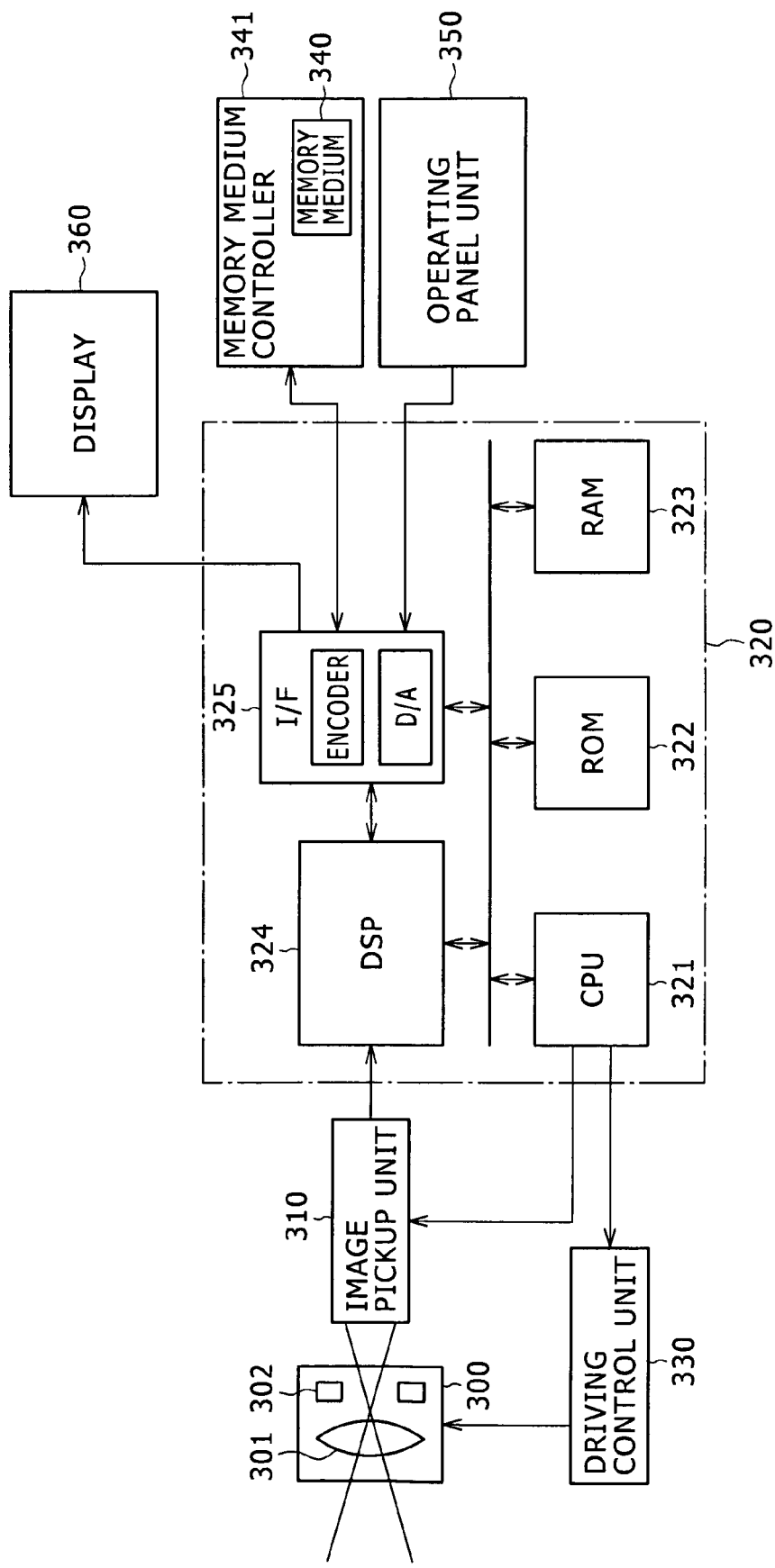
FIG. 25 is a block diagram showing an example of configuration of a camera device using a CCD image sensor.

FIG. 25 is a block diagram showing an example of configuration of a camera device using a CCD image sensor.

In FIG. 25, an image pickup unit 310 picks up an image of a subject using a CCD image sensor as shown in FIGS. 1A to 1D, for example, and then outputs an image pickup signal to a system control unit 320 incorporated in a main substrate. Specifically, the image pickup unit 310 subjects an output signal of the above-mentioned CCD image sensor to processing such as AGC (Automatic Gain Control), OB (Optical Black) clamping, CDS (Correlated Double Sampling), A/D conversion and the like, thereby generates a digital image pickup signal, and then outputs the image pickup signal.

Incidentally, in the present example, an image pickup signal is converted into a digital signal within the image pickup unit 310, and then the digital signal is output to the system control unit 320. However, a constitution may be provided in which an analog image pickup signal is sent from the image pickup unit 310 to the system control unit 320, and the analog image pickup signal is converted into a digital signal on the side of the system control unit 320. In addition, needless to say, the processing within the image pickup unit 310 includes various methods, and is not particularly limited.

An image pickup optical system 300 includes a zoom lens 301 disposed within a lens barrel, a diaphragm mechanism 302, and the like. The image pickup optical system 300 forms an image of a subject on a light receiving part of the CCD image sensor. Under control of a driving control unit 330 based on an instruction of the system control unit 320, each part of the image pickup optical system 300 is mechanically driven to perform control for autofocus and the like.

The system control unit 320 includes a CPU 321, a ROM 322, a RAM 323, a DSP 324, an external interface 325, and the like.

The CPU 321 sends an instruction to each part of the camera device using the ROM 322 and the RAM 323. The CPU 321 thereby controls the entire system.

The DSP 324 subjects the image pickup signal from the image pickup unit 310 to various signal processing. The DSP 324 thereby generates a video signal of a still image or a moving image in a predetermined format (for example a YUV signal).

The external interface 325 includes various encoders and a D/A converter. The external interface 325 exchanges various control signals and data with external elements (a display 360, a memory medium 340, and an operating panel unit 350 in the present example) connected to the system control unit 320.

The display 360 is a small display such for example as a liquid crystal panel incorporated in the camera device. The display 360 displays a picked-up image. Incidentally, in addition to such a small display incorporated in the camera device, a constitution in which image data is transmitted to an external large display device and displayed on the external large display device is of course possible.

The memory medium 340 includes various memory cards, for example. The memory medium 340 can store taken images as appropriate. The memory medium is replaceable in a memory medium controller 341, for example. In addition to various memory cards, disk media using magnetism and light and the like can be used as the memory medium 340.

The operating panel unit 350 has an input key for a user to give various instructions when performing a picture taking operation on the camera device. The CPU 321 monitors input signals from the operating panel unit 350, and performs various operation control on the basis of the input contents.

By applying the present invention to such a camera device, high-quality images of various subjects can be taken. Incidentally, it is understood that in the above constitutions, a method of combining unit devices and unit modules as constituent elements of a system, the scale of the set, and the like can be selected as appropriate on the basis of an actual situation for commercialization and the like, and that the image pickup device according to the present invention widely includes various modifications.

In addition, an object (subject) for image pickup in a solid-state image pickup device and an image pickup device according to an embodiment of the present invention is not limited to common picture objects such as a person, a landscape and the like, and the present invention can be applied to pickup of an image of a special fine image pattern by a counterfeit bill detector, a fingerprint detector or the like. A device configuration in this case is not a typical camera device shown in FIG. 25, but further includes a special image pickup optical system and a system for signal processing including pattern analysis. Also in this case, actions and effects of the present invention can be fully exerted to realize accurate image detection.

Further, when a remote system for telemedicine, crime prevention monitoring, personal authentication or the like is to be configured, a device configuration including a communication module connected to a network as described above can be provided. Thus, a wide variety of applications are possible.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image pickup device comprising:
a plurality of light receiving units arranged in a form of a matrix in a horizontal direction and a vertical direction;

a transfer channel in a plurality of columns for transferring a signal charge accumulated in said light receiving units in the vertical direction;

a first transfer electrode for reading a signal charge accumulated in said light receiving unit and transferring the signal charge in the vertical direction, the first transfer electrode being disposed above said transfer channel adjacent to a central part in the vertical direction of said light receiving unit;

a second transfer electrode for transferring the signal charge transferred by the first transfer electrode in the vertical direction, the second transfer electrode being disposed above said transfer channel in a same layer as said first transfer electrode;

first wiring for coupling said first transfer electrodes in a same row of said matrix to each other in the horizontal direction; and second wiring for coupling said second transfer electrodes in a same row of said matrix to each other in the horizontal direction;

wherein film thickness of said first transfer electrode and said second transfer electrode is smaller than film thickness of said first wiring and said second wiring when said first wiring and said second wiring are formed by polysilicon, said second wiring is disposed on said second transfer electrode, said first wiring includes a horizontal part disposed in a layer above said second wiring and extending in the horizontal direction and a branch part extending from said horizontal part in a form of a branch in the vertical direction and extending on said first transfer electrode, and said branch part is bent from said horizontal part toward said first transfer electrode and extends on said first transfer electrode such that a space of a transparent interlayer insulating film is formed over said branch part extending on the first transfer electrode.

2. The solid-state image pickup device according to claim 1, wherein said first transfer electrode and said second transfer electrode are formed of polysilicon.

3. The solid-state image pickup device according to claim 1, wherein said first wiring and said second wiring are formed of polysilicon.

4. The solid-state image pickup device according to claim 1, wherein said first wiring is formed of polysilicon, and said second wiring is formed of one of metals of W, Al, Ti, Cu, Ta, Pt, Ir, and Ru, an alloy of at least two of W, Al, Ti, Cu, Ta, Pt, Ir, and Ru, silicide, nitride, and a laminate of one of silicide and nitride.

5. The solid-state image pickup device according to claim 1, wherein said first wiring is formed of one of metals of W, Al, Ti, Cu, Ta, Pt, Ir, and Ru, an alloy of at least two of W, Al, Ti, Cu, Ta, Pt, Ir, and Ru, silicide, nitride, and a laminate of one of silicide and nitride, and said second wiring is formed of polysilicon.

6. The solid-state image pickup device according to claim 5, wherein said first wiring is formed so as to cover said first transfer electrode and said second transfer electrode, and serves also as a light shielding film forming an opening of said light receiving unit.

7. The solid-state image pickup device according to claim 1, wherein said first wiring and said second wiring are formed of one of metals of W, Al, Ti, Cu, Ta, Pt, Ir, and Ru, an alloy of at least two of W, Al, Ti, Cu, Ta, Pt, Ir, and Ru, silicide, nitride, and a laminate of one of silicide and nitride.

8. The solid-state image pickup device according to claim 7, wherein said first wiring and said second wiring are formed so as to cover said first transfer electrode and said second transfer electrode, and serve also as a light shielding film forming an opening of said light receiving unit.

9. The solid-state image pickup device according to claim 1, wherein said second transfer electrodes in a same row of said matrix are coupled to each other in the horizontal direction.

10. A method of manufacturing a solid-state image pickup device, said method comprising the steps of:

forming, on a semiconductor substrate, a plurality of light receiving units arranged in a form of a matrix in a horizontal direction and a vertical direction and a transfer channel in a plurality of columns for transferring a signal charge accumulated in said light receiving units in the vertical direction;

forming a first transfer electrode for reading a signal charge accumulated in said light receiving unit and transferring the signal charge in the vertical direction above said transfer channel adjacent to a central part in the vertical direction of said light receiving unit, and simultaneously forming a second transfer electrode for transferring the signal charge transferred by said first transfer electrode in the vertical direction above said transfer channel in a same layer as said first transfer electrode;

forming second wiring for coupling said second transfer electrodes in a same row of said matrix to each other in the horizontal direction; and forming first wiring for coupling said first transfer electrodes in a same row of said matrix to each other in the horizontal direction;

wherein said transfer electrode forming step forms said first transfer electrode and said second transfer electrode such that film thickness of said first transfer electrode and said second transfer electrode is smaller than film thickness of said first wiring and said second wiring when said first wiring and said second wiring are formed by polysilicon, said second wiring is formed on said second transfer electrode, said first wiring is formed with a horizontal part disposed in a layer above said second wiring and extending in the horizontal direction and a branch part extending from said horizontal part in a form of a branch in the vertical direction and extending on said first transfer electrode, and said branch part is formed so as to be bent from said horizontal part toward said first transfer electrode and extend on said first transfer electrode such that a space of a transparent interlayer insulating film is formed over said branch part extending on said first transfer electrode.

11. A solid-state image pickup device comprising:

a plurality of light receiving units arranged in a form of a matrix in a horizontal direction and a vertical direction;

a transfer channel in a plurality of columns for transferring a signal charge accumulated in said light receiving units in the vertical direction;

a first transfer electrode for reading a signal charge accumulated in said light receiving unit and transferring the signal charge in the vertical direction, the first transfer electrode being disposed above said transfer channel adjacent to a central part in the vertical direction of said light receiving unit;

a second transfer electrode for transferring the signal charge transferred by said first transfer electrode in the vertical direction, the second transfer electrode being disposed above said transfer channel in a same layer as said first transfer electrode;

first wiring for coupling said first transfer electrodes in a same row of said matrix to each other in the horizontal direction; and second wiring for coupling said second transfer electrodes in a same row of said matrix to each other in the horizontal direction, the second wiring being formed by a same layer as said first wiring;

wherein film thickness of said first transfer electrode and said second transfer electrode is smaller than film thickness of said first wiring and said second wiring when said first wiring and said second wiring are formed by polysilicon, said second wiring is disposed on said second transfer electrode, said first wiring includes a horizontal part extending in the horizontal direction in proximity to said second wiring and a branch part extending from said horizontal part in a form of a branch in the vertical direction and extending on said first transfer electrode, and said branch part is connected to said first transfer electrode via a contact.

12. A method of manufacturing a solid-state image pickup device, said method comprising the steps of:

forming, on a semiconductor substrate, a plurality of light receiving units arranged in a form of a matrix in a horizontal direction and a vertical direction and a transfer channel in a plurality of columns for transferring a signal charge accumulated in said light receiving units in the vertical direction;

forming a first transfer electrode for reading a signal charge accumulated in said light receiving unit and transferring the signal charge in the vertical direction above said transfer channel adjacent to a central part in the vertical direction of said light receiving unit, and simultaneously forming a second transfer electrode for transferring the signal charge transferred by said first transfer electrode in the vertical direction above said transfer channel in a same layer as said first transfer electrode; and a wiring forming step of simultaneously forming first wiring for coupling said first transfer electrodes in a same row of said matrix to each other in the horizontal direction and second wiring for coupling said second transfer electrodes in a same row of said matrix to each other in the horizontal direction;

wherein said transfer electrode forming step forms said first transfer electrode and said second transfer electrode such that film thickness of said first transfer electrode and said second transfer electrode is smaller than film thickness of said first wiring and said second wiring when said first wiring and said second wiring are formed by polysilicon, said wiring forming step forms said second wiring on said second transfer electrode, and simultaneously forms said first wiring with a horizontal part extending in the horizontal direction in proximity to said second wiring and a branch part extending from said horizontal part in a form of a branch in the vertical direction and extending on said first transfer electrode, and said branch part is connected to said first transfer electrode via a contact.

13. A solid-state image pickup device comprising:

a plurality of light receiving units arranged in a form of a matrix in a horizontal direction and a vertical direction;

a transfer channel in a plurality of columns for transferring a signal charge accumulated in said light receiving units in the vertical direction;

a first transfer electrode for reading a signal charge accumulated in said light receiving unit and transferring the signal charge in the vertical direction, the first transfer electrode being disposed above said transfer channel adjacent to a central part in the vertical direction of said light receiving unit;

a second transfer electrode for transferring the signal charge transferred by said first transfer electrode in the vertical direction, the second transfer electrode being disposed above said transfer channel in a same layer as said first transfer electrode;

a third transfer electrode for transferring the signal charge transferred by said second transfer electrode in the vertical direction, the third transfer electrode being disposed above said transfer channel in the same layer as said first transfer electrode;

first wiring for coupling said first transfer electrodes in a same row of said matrix to each other in the horizontal direction;

second wiring for coupling said second transfer electrodes in a same row of said matrix to each other in the horizontal direction; and third wiring for coupling said third transfer electrodes in a same row of said matrix to each other in the horizontal direction;

wherein film thickness of said first transfer electrode, said second transfer electrode, and said third transfer electrode is smaller than film thickness of said first wiring, said second wiring, and said third wiring when said first wiring, said second wiring, and said third wiring are formed by polysilicon, said second wiring is disposed on said second transfer electrode, said third wiring is disposed on said third transfer electrode in a same layer as said second wiring, said first wiring includes a horizontal part disposed in a layer above said second wiring and said third wiring and extending in the horizontal direction and a branch part extending from said horizontal part in a form of a branch in the vertical direction and extending on said first transfer electrode, and said branch part is bent from said horizontal part toward said first transfer electrode and extends on said first transfer electrode such that a space of a transparent interlayer insulating film is formed over said branch part extending on the first transfer electrode.

14. A method of manufacturing a solid-state image pickup device, said method comprising the steps of:

forming, on a semiconductor substrate, a plurality of light receiving units arranged in a form of a matrix in a horizontal direction and a vertical direction and a transfer channel in a plurality of columns for transferring a signal charge accumulated in said light receiving units in the vertical direction;

forming a first transfer electrode for reading a signal charge accumulated in said light receiving unit and transferring the signal charge in the vertical direction above said transfer channel adjacent to a central part in the vertical direction of said light receiving unit, and simultaneously forming a second transfer electrode for transferring the signal charge transferred by said first transfer electrode in the vertical direction and a third transfer electrode for transferring the signal charge transferred by said second transfer electrode in the vertical direction above said transfer channel in a same layer as said first transfer electrode;

simultaneously forming second wiring for coupling said second transfer electrodes in a same row of said matrix to each other in the horizontal direction and third wiring for coupling said third transfer electrodes in a same row of said matrix to each other in the horizontal direction; and forming first wiring for coupling said first transfer electrodes in a same row of said matrix to each other in the horizontal direction;

wherein said transfer electrode forming step forms said first transfer electrode, said second transfer electrode, and said third transfer electrode such that film thickness of said first transfer electrode, said second transfer electrode, and said third transfer electrode is smaller than film thickness of said first wiring, said second wiring, and said third wiring when said first wiring, said second wiring, and said third wiring are formed by polysilicon, said second wiring is formed on said second transfer electrode and said third wiring is formed on said third transfer electrode, said first wiring is formed with a horizontal part disposed in a layer above said second wiring and said third wiring and extending in the horizontal direction and a branch part extending from said horizontal part in a form of a branch in the vertical direction and extending on said first transfer electrode, and said branch part is formed so as to be bent from said horizontal part toward said first transfer electrode and extend on said first transfer electrode such that a space of a transparent interlayer insulating film is formed over said branch part extending on said first transfer electrode.

15. A solid-state image pickup device comprising:
a plurality of light receiving units arranged in a form of a matrix in a horizontal direction and a vertical direction;
a transfer channel in a plurality of columns for transferring a signal charge accumulated in said light receiving units in the vertical direction;
a first transfer electrode for reading a signal charge accumulated in said light receiving unit and transferring the signal charge in the vertical direction, the first transfer electrode being disposed above said transfer channel adjacent to a central part in the vertical direction of said light receiving unit;
a second transfer electrode for transferring the signal charge transferred by said first transfer electrode in the vertical direction, the second transfer electrode being disposed above said transfer channel in a same layer as said first transfer electrode;
a third transfer electrode for transferring the signal charge transferred by said second transfer electrode in the vertical direction, the third transfer electrode being disposed above said transfer channel in the same layer as said first transfer electrode;

first wiring for coupling said first transfer electrodes in a same row of said matrix to each other in the horizontal direction;
second wiring for coupling said second transfer electrodes in a same row of said matrix to each other in the horizontal direction; and
third wiring for coupling said third transfer electrodes in a same row of said matrix to each other in the horizontal direction;
wherein film thickness of said first transfer electrode, said second transfer electrode, and said third transfer electrode is smaller than film thickness of said first wiring, said second wiring, and said third wiring when said first wiring, said second wiring, and said third wiring are formed by polysilicon,
said second wiring is disposed on said second transfer electrode,
said first wiring includes a first horizontal part disposed in a layer above said second wiring and extending in the horizontal direction and a first branch part extending from said first horizontal part in a form of a branch in the vertical direction and extending on said first transfer electrode,
said third wiring includes a third horizontal part disposed in a same layer as said first wiring and extending in the horizontal direction and a third branch part extending from said third horizontal part in a form of a branch in the vertical direction and extending on said third transfer electrode, and
said first branch part is bent from the first horizontal part toward said first transfer electrode and extends on said first transfer electrode such that a space of a transparent interlayer insulating film is formed over said first branch part extending on said first transfer electrode.

16. A method of manufacturing a solid-state image pickup device, said method comprising the steps of:
forming, on a semiconductor substrate, a plurality of light receiving units arranged in a form of a matrix in a horizontal direction and a vertical direction and a transfer channel in a plurality of columns for transferring a signal charge accumulated in said light receiving units in the vertical direction;
forming a first transfer electrode for reading a signal charge accumulated in said light receiving unit and transferring the signal charge in the vertical direction above said transfer channel adjacent to a central part in the vertical direction of said light receiving unit, and simultaneously forming a second transfer electrode for transferring the signal charge transferred by said first transfer electrode in the vertical direction and a third transfer electrode for transferring the signal charge transferred by said second transfer electrode in the vertical direction above said transfer channel in a same layer as said first transfer electrode;
a first wiring forming step of forming second wiring for coupling said second transfer electrodes in a same row of said matrix to each other in the horizontal direction; and
a second wiring forming step of simultaneously forming first wiring for coupling said first transfer electrodes in a same row of said matrix to each other in the horizontal direction and third wiring for coupling said third transfer electrodes in a same row of said matrix to each other in the horizontal direction;
wherein said transfer electrode forming step forms said first transfer electrode, said second transfer electrode, and said third transfer electrode such that film thickness of said first transfer electrode, said second transfer electrode, and said third transfer electrode is smaller than film thickness of said first wiring, said second wiring, and said third wiring when said first wiring, said second wiring, and said third wiring are formed by polysilicon, said second wiring is formed on said second transfer electrode, said first wiring is formed with a first horizontal part disposed in a layer above said second wiring and extending in the horizontal direction and a first branch part extending from said first horizontal part in a form of a branch in the vertical direction and extending on said first transfer electrode, and said third wiring is formed with a third horizontal part disposed in a same layer as said first wiring and extending in the horizontal direction and a third branch part extending from said third horizontal part in a form of a branch in the vertical direction and extending on said third transfer electrode, and said first branch part is formed so as to be bent from said horizontal part toward said first transfer electrode and extend on said first transfer electrode such that a space of a transparent interlayer insulating film is formed over said first branch part extending on said first transfer electrode.

17. An image pickup device comprising:
an image pickup unit using a solid-state image pickup device;
a control unit configured to control said image pickup unit; and
an operating unit configured to operate said image pickup unit;
wherein said solid-state image pickup device includes
  a plurality of light receiving units arranged in a form of a matrix in a horizontal direction and a vertical direction,
  a transfer channel in a plurality of columns for transferring a signal charge accumulated in said light receiving units in the vertical direction,
  a first transfer electrode for reading a signal charge accumulated in said light receiving unit and transferring the signal charge in the vertical direction, the first transfer electrode being disposed above said transfer channel adjacent to a central part in the vertical direction of said light receiving unit,
  a second transfer electrode for transferring the signal charge transferred by the first transfer electrode in the vertical direction, the second transfer electrode being disposed above said transfer channel in a same layer as said first transfer electrode,
  first wiring for coupling said first transfer electrodes in a same row of said matrix to each other in the horizontal direction, and
  second wiring for coupling said second transfer electrodes in a same row of said matrix to each other in the horizontal direction, and
  film thickness of said first transfer electrode and said second transfer electrode is smaller than film thickness of said first wiring and said second wiring when said first wiring and said second wiring are formed by polysilicon,
  said second wiring is disposed on said second transfer electrode,
  said first wiring includes a horizontal part disposed in a layer above said second wiring and extending in the horizontal direction and a branch part extending from said horizontal part in a form of a branch in the vertical direction and extending on said first transfer electrode, and said branch part is bent from said horizontal part toward said first transfer electrode and extends on said first transfer electrode such that a space of a transparent interlayer insulating film is formed over said branch part extending on the first transfer electrode.

18. A solid-state image pickup device comprising:
a plurality of light receiving units arranged in a form of a matrix in a horizontal direction and a vertical direction;
a transfer channel in a plurality of columns for transferring a signal charge accumulated in said light receiving units in the vertical direction;
a first transfer electrode for reading a signal charge accumulated in said light receiving unit and transferring the signal charge in the vertical direction, the first transfer electrode being disposed above said transfer channel adjacent to a central part in the vertical direction of said light receiving unit;
a second transfer electrode for transferring the signal charge transferred by the first transfer electrode in the vertical direction, the second transfer electrode being disposed above said transfer channel in a same layer as said first transfer electrode;
first wiring for coupling said first transfer electrodes in a same row of said matrix to each other in the horizontal direction; and
second wiring for coupling said second transfer electrodes in a same row of said matrix to each other in the horizontal direction;
wherein film thickness of said first transfer electrode and said second transfer electrode is smaller than film thickness of said first wiring and said second wiring when said first wiring and said second wiring are formed by polysilicon,
said second wiring is disposed on said second transfer electrode,
said first wiring includes a first horizontal part disposed in proximity to said second wiring in one of the same row and an adjacent row and extending in the horizontal direction and a first branch part extending from said first horizontal part in a form of a branch in the vertical direction and extending on said first transfer electrode,
said first branch part is bent from said first horizontal part toward said first transfer electrode and extends on said first transfer electrode such that a space of a transparent interlayer insulating film is formed over said first branch part extending on the first transfer electrode, and
said first wiring and said second wiring are each made of a metal, are formed so as to cover said first transfer electrode and said second transfer electrode, and serve also as a light shielding film forming an opening of said light receiving unit.

19. The solid-state image pickup device according to claim 18,
wherein said first wiring includes a first horizontal part disposed in proximity to said second wiring in the same row, a second horizontal part disposed in proximity to said second wiring in the adjacent row and extending in the horizontal direction, and a first branch part passing over said first transfer electrode from the first horizontal part and extending above said second transfer electrode, and said first wiring is formed in a form of a lattice by said first horizontal part, two said first branch parts adjacent to each other, and said second horizontal part.

20. The solid-state image pickup device according to claim 18,
wherein said first horizontal part of said first wiring is disposed in proximity to said second wiring in the adjacent row, and
said second wiring has a third horizontal part extending in the horizontal direction on said second transfer electrode and two second branch parts extending in the vertical direction from the third horizontal part and extending along both sides in the vertical direction of the first transfer electrode and the second transfer electrode under said first branch part of said first wiring.

* * * * *